(12) United States Patent
Ikariya et al.

(10) Patent No.: US 11,984,773 B2
(45) Date of Patent: May 14, 2024

(54) DRIVER FOR MOTORS

(71) Applicant: MITSUBA Corporation, Gunma (JP)

(72) Inventors: Tomoya Ikariya, Gunma (JP);
Takahiko Ogane, Gunma (JP);
Fumiaki Koshio, Gunma (JP);
Hiroyuki Hirano, Gunma (JP)

(73) Assignee: MITSUBA Corporation, Gunma (JP)

( * ) Notice: Subject to any disclaimer, the term of this patent is extended or adjusted under 35 U.S.C. 154(b) by 627 days.

(21) Appl. No.: 17/270,864

(22) PCT Filed: Mar. 8, 2019

(86) PCT No.: PCT/JP2019/009365
§ 371 (c)(1),
(2) Date: Feb. 24, 2021

(87) PCT Pub. No.: WO2020/049772
PCT Pub. Date: Mar. 12, 2020

(65) Prior Publication Data
US 2021/0184544 A1 Jun. 17, 2021

(30) Foreign Application Priority Data
Sep. 6, 2018 (JP) .................. 2018-167025

(51) Int. Cl.
*H02K 11/33* (2016.01)
*F04D 25/06* (2006.01)
(Continued)

(52) U.S. Cl.
CPC .............. *H02K 11/33* (2016.01); *F04D 25/06* (2013.01); *F04D 25/08* (2013.01);
(Continued)

(58) Field of Classification Search
CPC .... H02K 11/33; H02K 2211/03; H02K 5/225; F04D 25/06; F04D 25/08; F04D 29/5813;
(Continued)

(56) References Cited

U.S. PATENT DOCUMENTS 4,707,763 A 11/1987 Kudo
2018/0131256 A1 5/2018 Fujimoto

FOREIGN PATENT DOCUMENTS

CN 106659009 5/2017
EP 0309920 4/1989
(Continued)

OTHER PUBLICATIONS

"Search Report of Europe Counterpart Application", dated Sep. 30, 2021, pp. 1-12.
(Continued)

*Primary Examiner* — Mohamad A Musleh
(74) *Attorney, Agent, or Firm* — JCIPRNET

(57) ABSTRACT

A driver for motors according to the present invention is provided with: an aluminum substrate (10) which forms one surface of a housing; an insulating layer (11) which is formed on a surface of the aluminum substrate (10); a plurality of electronic elements (13) which are bonded onto a surface of the insulating layer (11), said surface being on a side opposite to the aluminum substrate (10); and a resin member (14) that covers the surface onto which the electronic elements (13) are bonded. This driver for motors is characterized in that the resin member (14) is obtained by integrating a mold resin part (20) which covers the electronic elements (13) from the upper surface side, a connector (21) which is electrically connected to the electronic elements (13), and a fitting part (22) which is used for fitting to a motor.

20 Claims, 17 Drawing Sheets

(51) Int. Cl.
  *F04D 25/08* (2006.01)
  *F04D 29/58* (2006.01)
  *H01L 23/28* (2006.01)
  *H05K 1/02* (2006.01)
  *H05K 1/05* (2006.01)
  *H05K 3/28* (2006.01)
  *H05K 7/20* (2006.01)
  *H01L 23/467* (2006.01)

(52) U.S. Cl.
  CPC .......... *F04D 29/5813* (2013.01); *H01L 23/28* (2013.01); *H05K 1/0204* (2013.01); *H05K 1/05* (2013.01); *H05K 3/284* (2013.01); *H05K 7/2039* (2013.01); *H01L 23/467* (2013.01); *H02K 2211/03* (2013.01); *H05K 2201/066* (2013.01); *H05K 2201/10159* (2013.01)

(58) Field of Classification Search
  CPC ... F04D 19/002; F04D 25/0613; H01L 23/28; H01L 23/467; H05K 1/0204; H05K 1/05; H05K 3/284; H05K 7/2039; H05K 2201/066; H05K 2201/10159; H05K 2201/09754; H05K 2201/10166; H05K 2203/1327; H05K 1/0203; H05K 1/056
  See application file for complete search history.

(56) References Cited

FOREIGN PATENT DOCUMENTS

| | | |
|---|---|---|
| JP | 2001128417 | 5/2001 |
| JP | 2008172861 | 7/2008 |
| JP | 2014014243 | 1/2014 |
| JP | 2015142455 | 8/2015 |
| JP | 2017184547 | 10/2017 |
| JP | 2017195663 | 10/2017 |
| WO | 2014155978 | 10/2014 |
| WO | WO-2016060046 A1 * | 4/2016 ............. B29C 70/72 |

OTHER PUBLICATIONS

Sakamoto N. et al., "Thermal design and structure of thick film hybrid IC based on insulated aluminium substrate", Ninth Annual IEEE Semiconductor Thermal Measurement and Management Symposium, vol. 2, Feb. 1993, pp. 186-193.

Office Action of European Counterpart Application, dated Nov. 9, 2023, pp. 1-6.

"International Search Report (Form PCT/ISA/210) of PCT/JP2019/009365," dated Apr. 16, 2019, with English translation thereof, pp. 1-4.

* cited by examiner

DRIVER FOR MOTORS

CROSS-REFERENCE TO RELATED APPLICATION

This application is a 371 application of the International PCT application serial no. PCT/JP2019/009365, filed on Mar. 8, 2019, which claims the priority benefits of Japan Patent Application No. 2018-167025, filed on Sep. 6, 2018. The entirety of each of the above-mentioned patent applications is hereby incorporated by reference herein and made a part of this specification.

BACKGROUND

Technical Field

The present invention relates to a driver for motors such as a brushless fan motor or the like.

The application claims priority based on Japanese Patent Application No. 2018-167025 filed in Japan on Sep. 6, 2018, and contents thereof are incorporated herein by reference.

Related Art

For example, a brushless motor may be used as a fan motor. The fan motor may include a cooling fan and a circuit apparatus, the cooling fan is rotated by the fan motor and forms a cooling air flow in an axial direction by the rotation, and the circuit apparatus is arranged on the upper side of the fan motor in a vehicle attachment state and serves as a driver that controls the drive of the fan motor.

LITERATURE OF RELATED ART

Patent Literature

Patent literature 1: Japanese Patent Laid-Open No. 2008-172861

SUMMARY

Problems to be Solved

In the brushless motor of the aforementioned prior art, the circuit apparatus serving as the driver for controlling the drive of the fan motor is cooled by blowing air from the cooling fan.

However, in the brushless motor, the driver may not be sufficiently cooled depending on a position where the cooling air hits, and there is also a risk that heat dissipation is insufficient.

In addition, in the brushless motor, the driver is usually not removable, and the driver cannot be arranged in a position other than a default position. Thus, in the brushless motor, there is a possibility that sufficient measures such as adjusting the driver position when the cooling air does not hit cannot be taken.

Therefore, the present invention provides a driver for motors which can take sufficient heat countermeasures in a manner that a heat dissipation mechanism is arranged in the driver and attachment to/detachment from the motor can also be easily performed.

Means to Solve Problems

In order to solve the above problems, the present invention proposes the following means.

The driver for motors of the present invention includes: an aluminum substrate which forms one surface of a housing; an insulating layer which is formed on a surface of the aluminum substrate; a plurality of electronic elements which are bonded to the insulating layer at a surface on a side opposite to the aluminum substrate; and a resin member that covers the surface onto which the electronic elements are bonded. This driver for motors is characterized in that the resin member is obtained by integrating a mold resin part which covers the electronic elements from an upper surface side, a connector which is electrically connected to the electronic elements, and a fitting part which is used for fitting to a motor.

With the above configuration, heat generated by the electronic elements of the driver can be efficiently released to the outside through the aluminum substrate which forms one surface of the housing.

In addition, in the above invention, by arranging the resin member which is obtained by integrating the mold resin part, the connector, and the fitting part on the aluminum substrate, molding of the electronic elements, electrical connection to the electronic elements, and fitting/removal/position adjustment to the motor can be performed at once.

The driver for motors of the present invention is characterized in that the fitting part of the resin member has a frame capable of accommodating the electronic elements, and the mold resin part is filled in the frame.

With the above configuration, through the frame, the driver can be easily fitted to the motor and the mold resin part can be easily filled.

The driver for motors of the present invention is characterized in that a surface of the aluminum substrate which is positioned on a side opposite to the insulating layer is black.

With the above configuration, emissivity can be improved by the black surface of the aluminum substrate, and heat dissipation of the electronic elements can be further improved.

The driver for motors of the present invention is characterized in that a heat sink is arranged on a surface of the aluminum substrate which is positioned on a side opposite to the insulating layer.

With the above configuration, the heat can be efficiently released through the aluminum substrate and the heat sink.

The driver for motors of the present invention is characterized in that one of the plurality of electronic elements is a memory, and a connector for writing to the memory is arranged as the connector.

With the above configuration, a variety of data (for example, a serial number, a producing process history, shipping inspection data, and the like) can be written to the memory among the electronic elements through the connector.

The driver for motors of the present invention is characterized in that the electronic elements are used as a control part for a motor that drives a cooling fan.

With the above configuration, the cooling fan can be driven efficiently.

The driver for motors of the present invention is characterized in that a ventilation area of the cooling fan driven by the motor is arranged on a surface of the aluminum substrate which is positioned on the a side opposite to the insulating layer.

With the above configuration, the cooling efficiency of the electronic elements can be improved.

Effect

According to the present invention, the heat generated by the electronic elements of the driver can be efficiently released to the outside through the aluminum substrate which forms one surface of the housing.

In addition, in the above invention, by arranging the resin member which is obtained by integrating the mold resin part, the connector, and the fitting part on the aluminum substrate, the molding of the electronic elements, the electrical connection to the electronic elements, and the fitting/removal/position adjustment to the motor can be performed at once, and attachment to/detachment from the motor can be freely performed.

DESCRIPTION OF THE EMBODIMENTS

A driver 100 of a motor 101 according to an embodiment of the present invention is described with reference to FIGS. 1 to 8.

Figure 1:
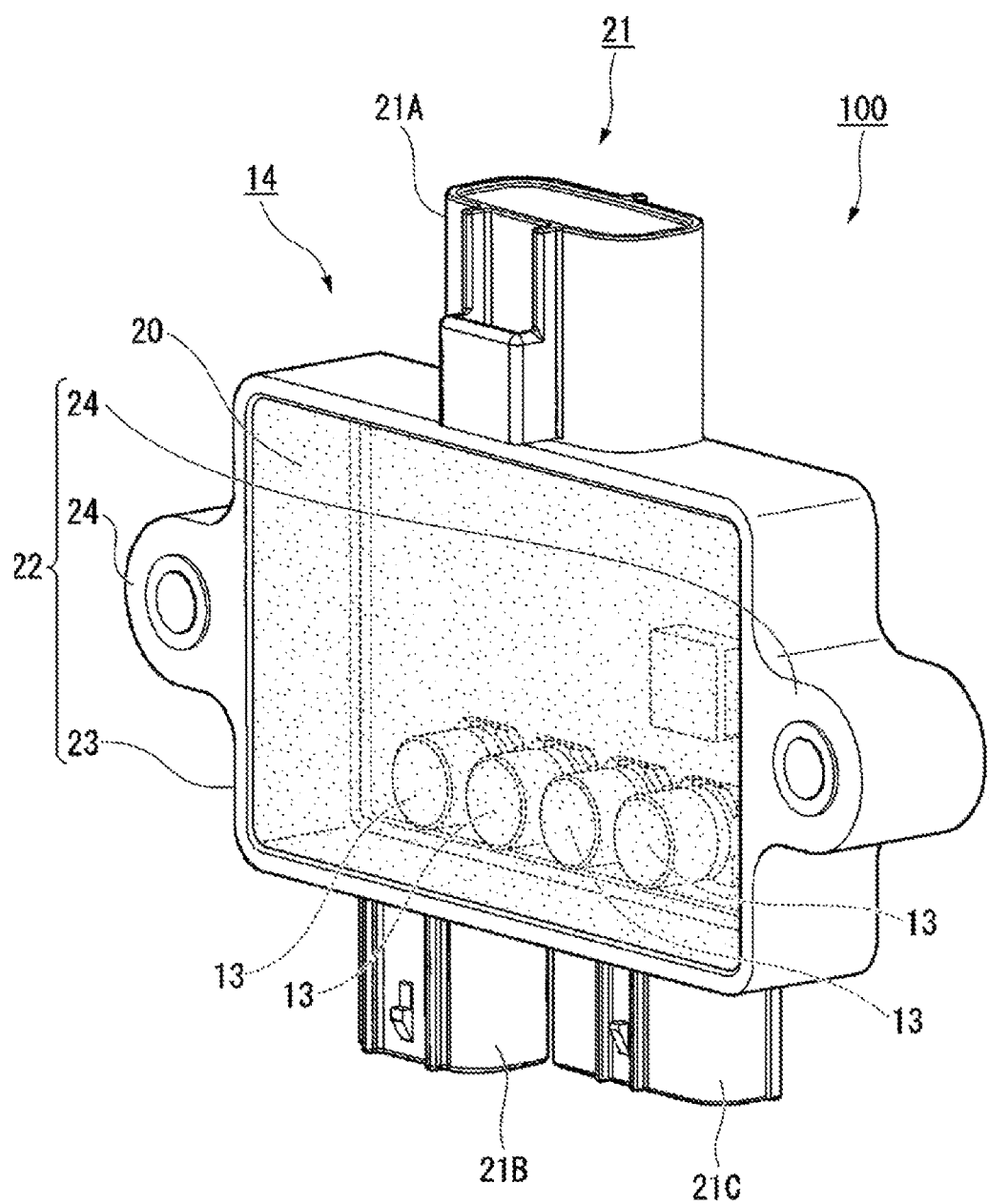
FIG. 1 is a perspective view of a driver according to an embodiment of the present invention as viewed from the front side.
Figure 2:
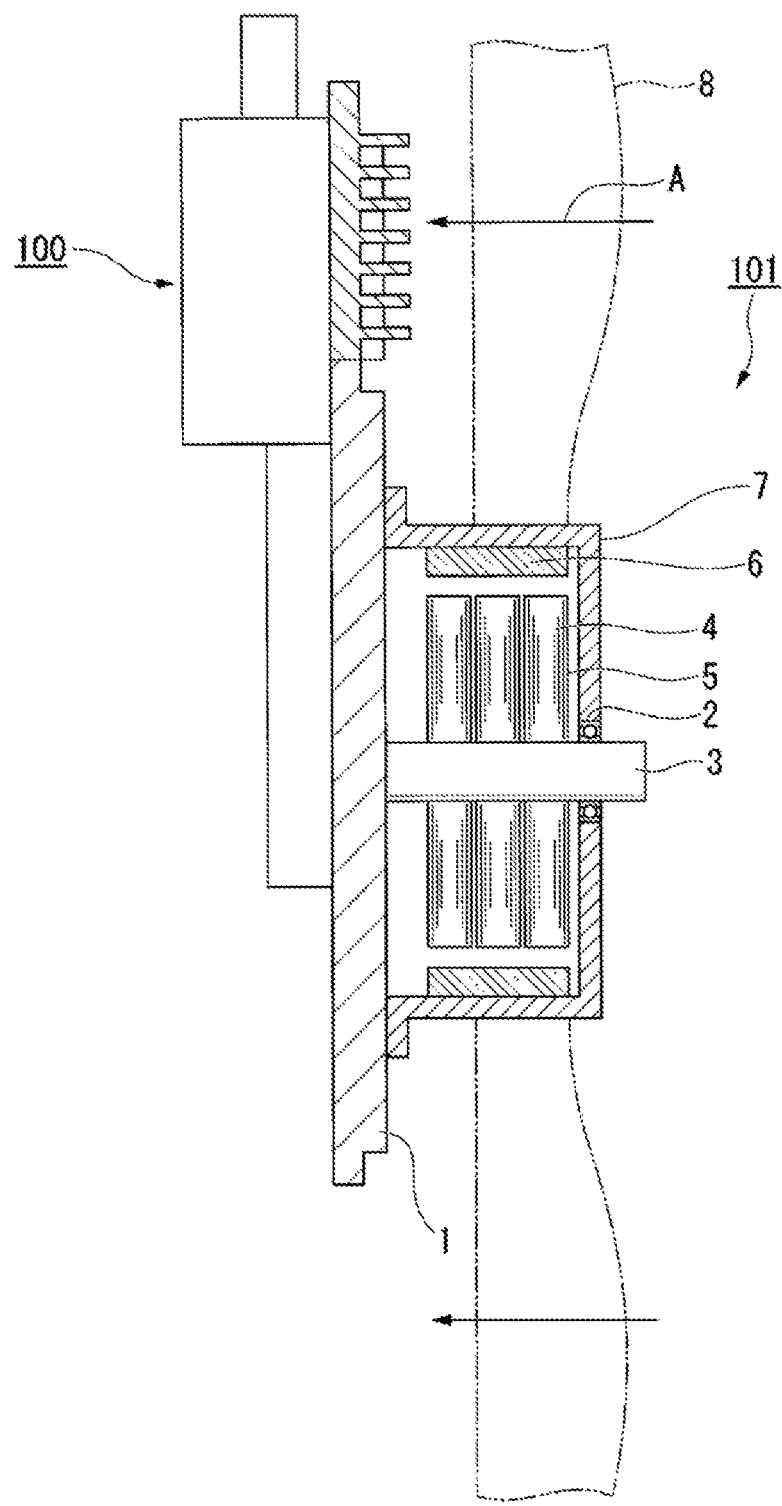
FIG. 2 is a schematic configuration diagram showing a state in which the driver is installed on a motor according to the embodiment of the present invention.

FIG. 1 is a perspective view of the driver 100 according to the embodiment as viewed from the front side. FIG. 2 is a schematic configuration diagram showing a state in which the driver 100 is installed on the motor 101.

The motor 101 shown in FIG. 2 is used as, for example, a fan motor. The motor 101 includes: a supporter 1 serving as a base; a rotary shaft 3 erected on the supporter 1; a substantially bottomed tubular rotor 7 supported by the rotary shaft 3 via a bearing member 2 to rotate freely; and a stator 5 fixed to the radially inner side of the rotor 7.

A winding wire 4 is wound around the stator 5. A rotor magnet 6 is arranged on an inner peripheral surface of the rotor 7. The winding wire 4 and the rotor magnet 6 are arranged at intervals in the radial direction. In addition, a cooling fan 8 that generates cooling air by the rotation is arranged on an outer peripheral surface of the rotor 7.

In the motor 101 as described above, power supply to the winding wire 4 of each phase is switched based on a control signal from the driver 100 which serves as a controller, and thereby a rotation magnetic field is generated in the stator 5. Then, in the motor 101, the rotation magnetic field generated in the stator 5 acts on the rotor magnet 6 to rotate the rotor 7, and the cooling fan 8 also rotates with the rotor 7. This rotation of the cooling fan 8 produces cooling air indicated by an arrow A in FIG. 2. Moreover, with regard to the driver 100 in FIGS. 1 and 2, the case is shown where the driver 100 is used as a controller of the motor 101 for driving the cooling fan 8, but it is an example and the driver 100 can be applied to motors for various purposes.

Next, the configuration of the driver 100 serving as the controller is described with reference to FIGS. 1, 3, 4, 5A, and 5B.

Figure 3:
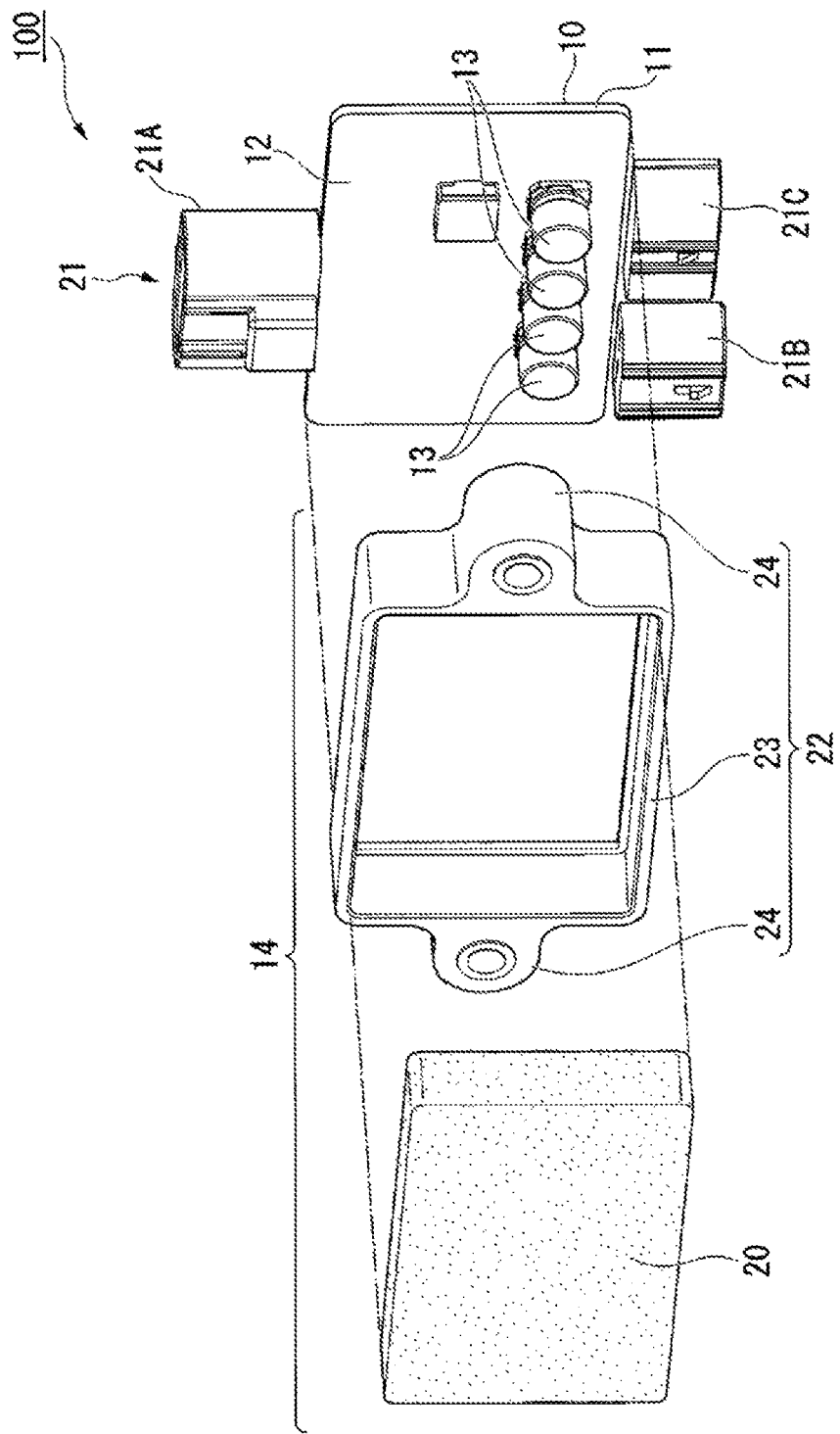
FIG. 3 is an exploded perspective view of the driver according to the embodiment of the present invention.
Figure 5A:
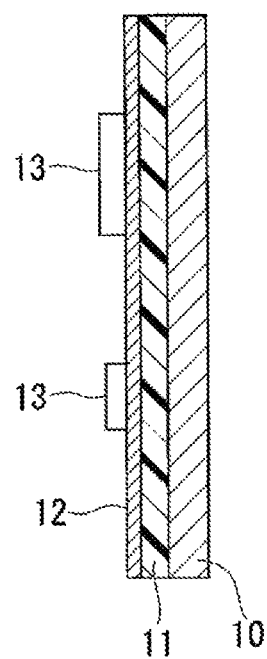
FIG. 5A is a cross-sectional view showing a substrate portion of the driver according to the embodiment of the present invention and shows an example of a case where an alumite treatment is not performed on an outer surface of an aluminum substrate.

As shown in FIGS. 2, 3, and 5A, the driver 100 includes: an aluminum substrate 10 forming one surface of a housing; an insulating layer 11 formed on a surface of the aluminum substrate 10; a plurality of electronic elements 13 bonded to a copper foil layer 12 (see FIG. 5A) which is on the insulating layer 11; and a resin member 14 that covers a surface onto which these electronic elements 13 are bonded.

As shown in FIG. 5A, the copper foil layer 12 on the insulating layer 11 and the electronic elements 13 are sequentially laminated on an upper surface of the aluminum substrate 10. In addition, the insulating layer 11 is made of an epoxy resin.

Figure 4:
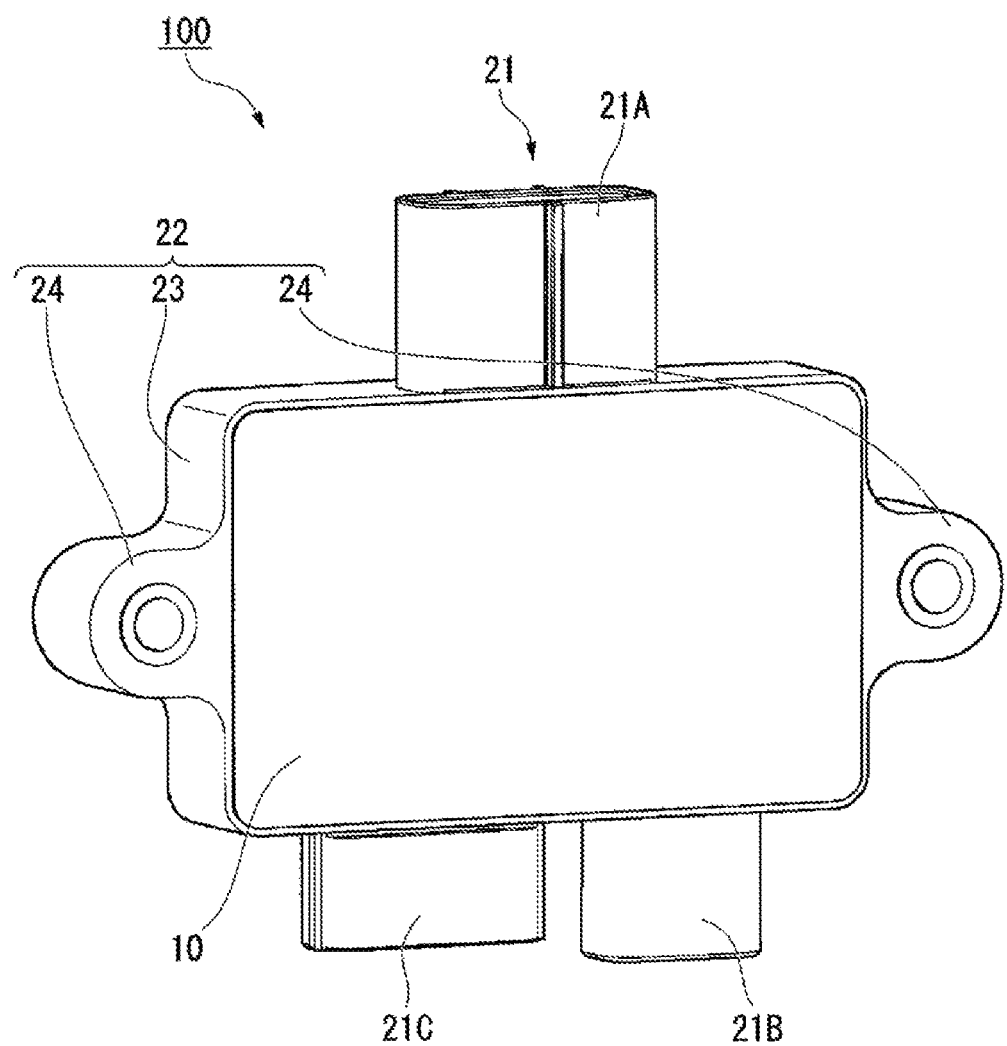
FIG. 4 is a perspective view of the driver according to the embodiment of the present invention as viewed from the back side.
Figure 5B:
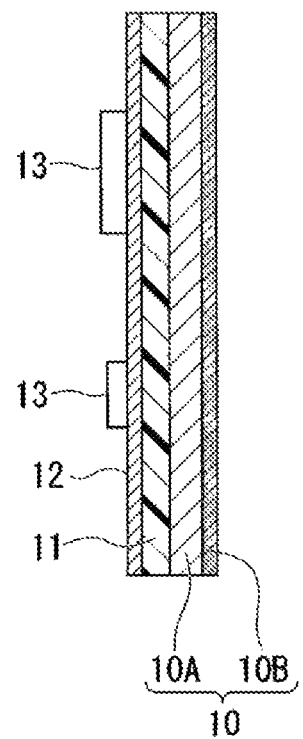
FIG. 5B is a cross-sectional view showing the substrate portion of the driver according to the embodiment of the present invention and shows an example of a case where an alumite treatment is not performed on the outer surface of the aluminum substrate.

Moreover, the aluminum substrate 10 may be composed of a single aluminum layer 10A as shown in FIGS. 4 and 5A. In addition, in the aluminum substrate 10, as shown in FIG. 5B, an insulation oxide film 10B may be integrally formed on the aluminum layer 10A and the insulation oxide film 10B is made of an aluminum oxide film by applying an alumite treatment to the outer surface side of the aluminum layer 10A. Besides, by forming this insulation oxide film 10B, application of static electricity from the outside can be blocked and insulation resistance can be improved.

In the plurality of electronic elements 13, an integrated driver unit (iDU) is formed in which driver components (for example, a microcomputer, a control integrated circuit (IC), a field effect transistor (FET), a capacitor, a choke coil, and the like) are integrated into one package.

In addition, a memory function is arranged inside the plurality of electronic elements 13 in which the iDU is formed.

In the memory, codes that can identify individuals, a producing process history, shipping inspection data, and the like can be written/read as digital data.

As shown in FIG. 3, the resin member 14 has a configuration in which a mold resin part 20 that covers the electronic elements 13 from the upper surface, a connector 21 electrically connected to the electronic elements 13, and a fitting part 22 for fitting the motor 101 are integrated.

The fitting part 22 includes a frame 23 which is fixed to a peripheral edge of the aluminum substrate 10 and in which the electronic elements 13 are accommodated, and fitting holes 24 which are arranged on both sides of the frame 23 in a way of being projected outward. Besides, the frame 23 is detachably fitted to the motor 101 via fitting screws (not shown) inserted into the fitting holes 24.

In addition, the mold resin part 20 is formed by filling the frame 23 of the fitting part 22 installed on the aluminum substrate 10 with a coating resin.

In addition, because the frame 23 is arranged separately from the other members, the frame 23 can be appropriately changed according to a size and a fitting position of the aluminum substrate 10.

In addition, as the connector 21, a connector for motor three-phase wire (U, V, W) 21A is arranged in the upper part of the diagram, a command DUTY connector 21B for power supply, GND, motor drive, and motor stop, and a connector 21C capable of controller area network (CAN) communication are respectively arranged in the lower part of the diagram.

Besides, in the driver 100 configured as described above, heat generated by the electronic elements 13 can be efficiently released to the outside through the aluminum substrate 10 which forms one surface of the housing.

In addition, in the driver 100, the resin member 14 obtained by integrating the mold resin part 20, the connector 21, and the fitting part 22 can be installed on the aluminum substrate 10. Therefore, molding of the electronic elements 13, electrical connection to the electronic elements 13, and fitting/removal/position adjustment to the motor 101 can be performed at once, and attachment to/detachment from the motor 101 can be freely performed.

In addition, in the driver 100, the frame 23 capable of accommodating the electronic elements 13 is arranged as the fitting part 22 of the resin member 14, and the mold resin part 20 is filled in the frame 23. Besides, with this configuration, the driver can be easily fitted to the motor 101 and the mold resin part 20 can be easily filled through the frame 23.

In addition, in the driver 100, the memory is arranged in the plurality of electronic elements 13, and the connector 21C capable of controller area network (CAN) communication is arranged as the connector 21.

Besides, with this configuration, a variety of data (for example, a serial number, producing process history, shipping inspection data, and the like) can be easily written/read to the memory in the electronic elements 13 through the connector 21C.

In addition, the driver 100 is used as a control part of the motor 101 for driving the cooling fan 8 and thereby can efficiently drive the cooling fan 8.

The configuration of the driver 100 shown in the above embodiment may be varied as follows.

Variation Example 1

In the driver 100, a back surface of the aluminum substrate 10 positioned on a side opposite to the insulating layer 11 may be colored to black or a dark color close to black. Besides, with this configuration, the black surface of the aluminum substrate 10 can improve emissivity and can further improve heat dissipation of the electronic elements 13.

Variation Example 2

In the driver 100, the configuration is shown in which the fitting holes 24 are arranged on the both sides of the frame 23 as the fitting part 22, but the present invention is not limited hereto, and the fitting holes 24 may be directly formed on the both sides of the mold resin part 20 without arranging the frame 23.

Variation Example 3

Figure 6:
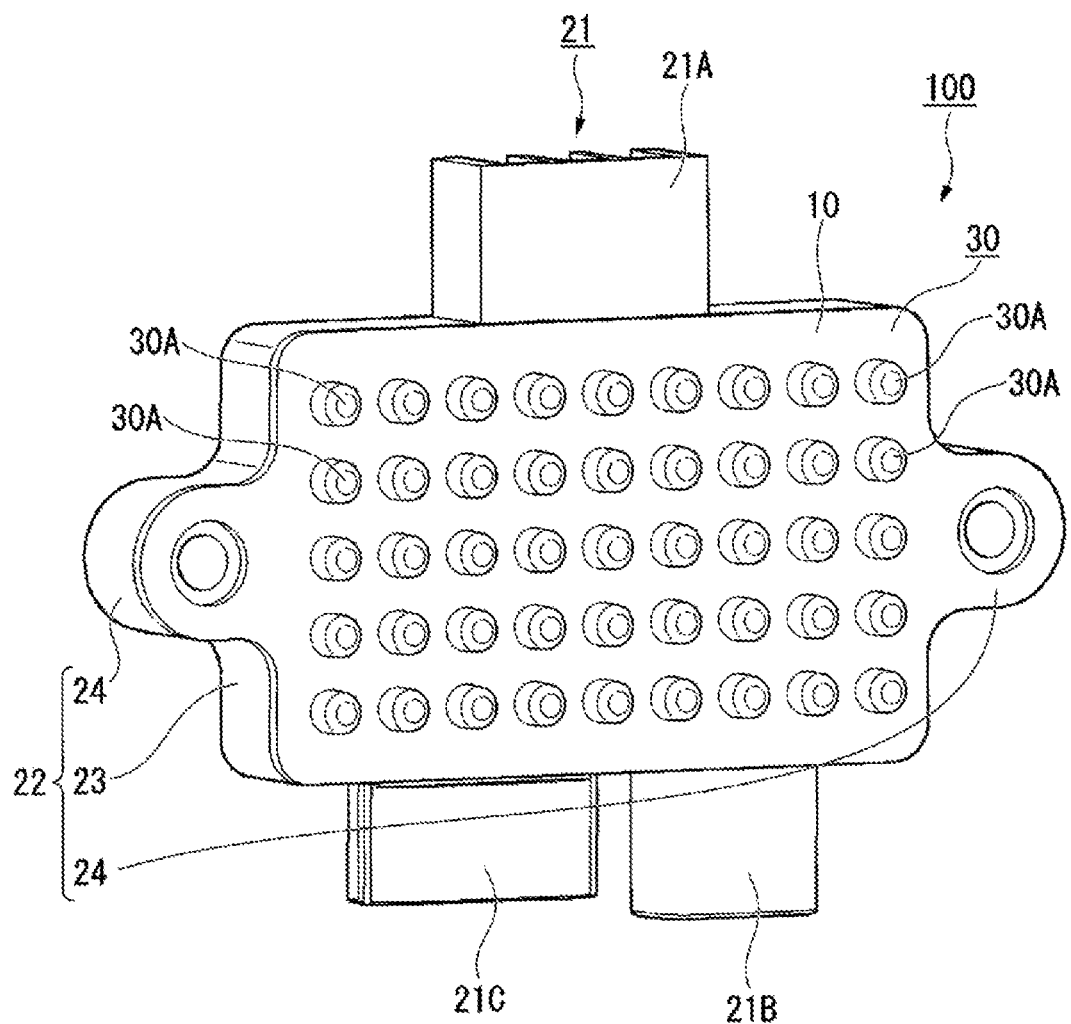
FIG. 6 is a perspective view when a heat sink is arranged on the back surface of the aluminum substrate according to the embodiment of the present invention.

In the driver 100, as shown in FIG. 6, a heat sink 30 may be arranged on the back surface of the aluminum substrate 10 positioned on a side opposite to the insulating layer 11. The heat sink 30 may have a configuration in which a large number of projecting bodies 30A are arranged in a matrix shape on the back surface of the aluminum substrate 10. Moreover, these projecting bodies 30A may be arranged on the entire back surface of the aluminum substrate 10, or may be partially arranged in a ventilation area where cooling air A from the cooling fan 8 hits.

Besides, with the above configuration, the heat can be efficiently released from the electronic elements 13 through the aluminum substrate 10 and the heat sink 30.

Variation Example 4

Figure 7:
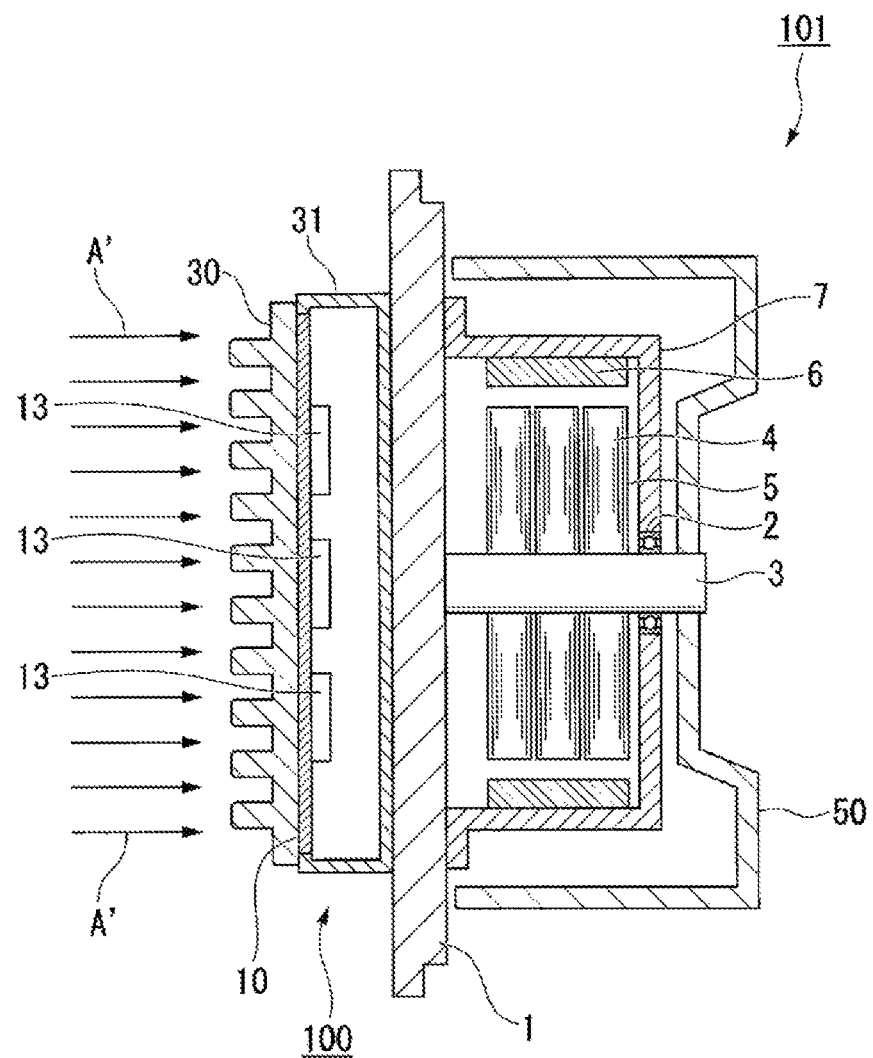
FIG. 7 is a cross-sectional view when the aluminum substrate of the driver according to the embodiment of the present invention is installed on a side opposite to the motor.

In the driver 100, the aluminum substrate 10 of the driver 100 is arranged on the side of the supporter 1 serving as the base of the motor 101. However, the present invention is not limited hereto, and as shown in FIG. 7, a substrate support member 31 may be installed on the supporter 1, and the aluminum substrate 10 may be positioned in a manner of facing a side opposite to the motor 101 via the substrate support member 31. Moreover, in FIG. 7, the motor 101 is arranged inside a bottomed tubular case 50, and the supporter 1 closes an opening of the case 50 (the same applies to FIG. 8 below).

At this time, the heat sink 30 may be installed on the back side of the aluminum substrate 10, and cooling air A' from the fan may be guided to the heat sink 30.

Variation Example 5

In the resin member 14 of the driver 100, the connector for motor three-phase wire (U, V, W) 21A of the connector 21 is positioned in the upper part of the frame 23 as shown in FIGS. 1, 3, 4, and 6.

Figure 9:
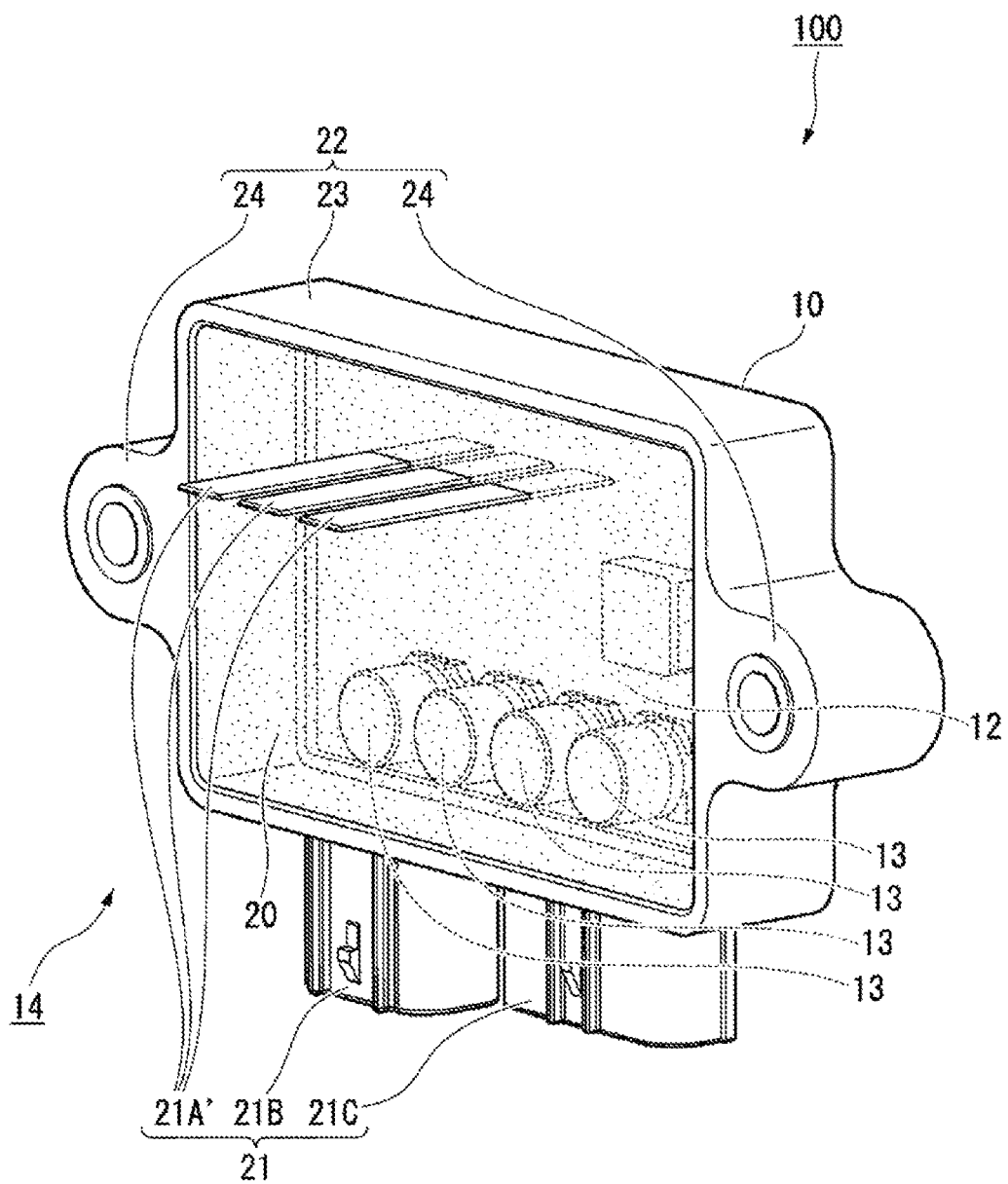
FIG. 9 is a perspective view when a connector for motor three-phase wire according to the embodiment of the present invention is projected toward a mold resin side.

However, the present invention is not limited hereto, and as shown in FIG. 9, a connector for motor three-phase wire 21A' of the connector 21 may be projected from the frame 23 to the front side where the mold resin part 20 is positioned.

At this time, in the connector for motor three-phase wire 21A' of the connector 21, by projecting from the frame 23 to the front side in a vertical direction or an inclined direction, a degree of freedom of connector connection can be increased, and wiring layout can be performed freely.

Variation Example 6

In addition, the aluminum substrate 10 may be a substrate having high thermal conductivity such as a ceramic substrate or the like. In addition, the connector 21C may be SPI communication or other non-standardized original communication as a communication specification other than the CAN communication.

Figure 8:
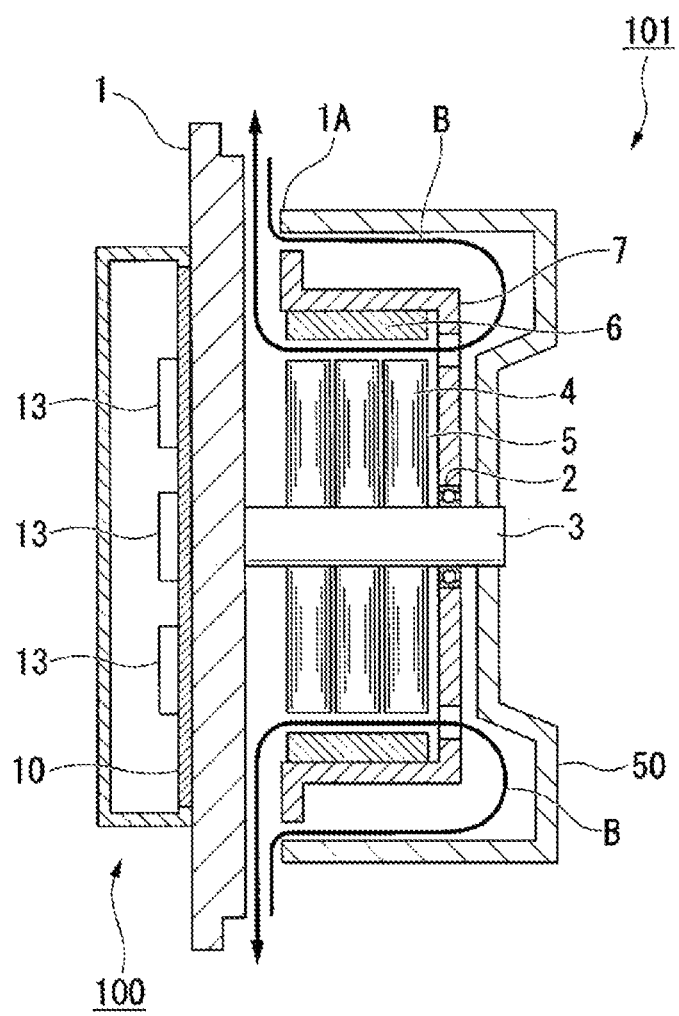
FIG. 8 is a cross-sectional view when the aluminum substrate of the driver according to the embodiment of the present invention is installed on the motor side.

In addition, the present invention is not limited hereto, and as shown in FIG. 8, the aluminum substrate 10 of the driver 100 may be arranged on the side of the supporter 1 serving as the base of the motor 101 and in the vicinity of the rotation shaft 3. At this time, the heat of the electronic elements 13 transmitted to the aluminum substrate 10 may be transmitted to the back side through the supporter 1 and then discharged to the outside by circulating air B circulating in the supporter 1. Moreover, the circulating air B may be sucked and exhausted through a gap 1A between the case 50 and the supporter 1 by the rotation of the rotor 7.

In addition, FIGS. 7 and 8 are schematic configuration diagrams, and description of the insulating layer 11 and the copper foil layer 12 is omitted.

Hereinafter, configurations and functions of a plurality of (seven) intelligent power devices (IPDs) used as units corresponding to the above iDU are described.

Figure 10:
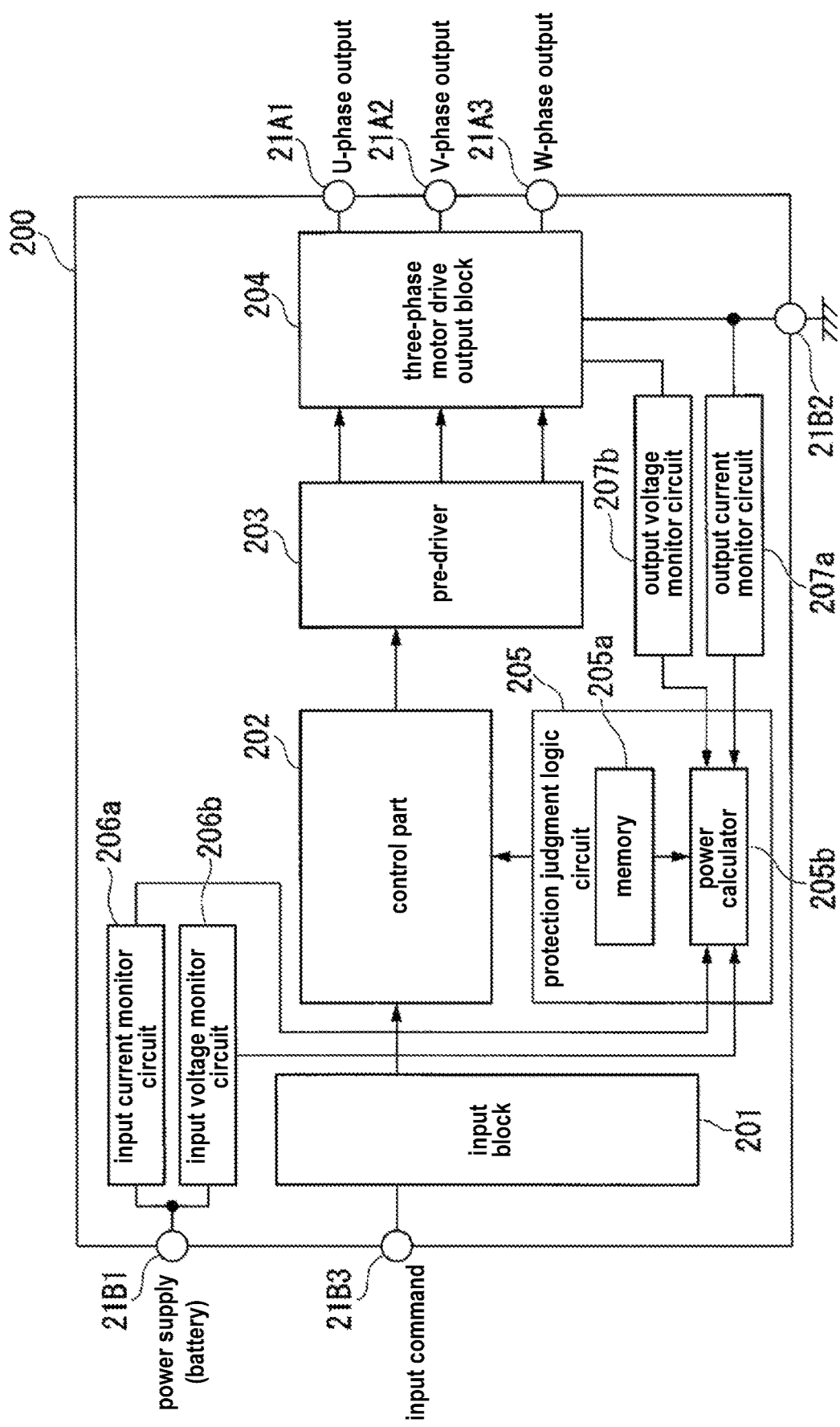
FIG. 10 is a block diagram showing a configuration of an IPD 200.

First, an IPD 200 is described. FIG. 10 is a block diagram showing a configuration of the IPD 200.

The IPD 200 is a device capable of arbitrarily limiting input power input to the IPD and output power output by the IPD.

The IPD 200 includes an input block 201, a control part 202, a pre-driver 203, a three-phase motor drive output block 204, and a protection judgment logic circuit 205.

The input block 201 outputs a command for driving the motor and stopping the motor, which is input to an input terminal 21B3, to the control part 202 as a motor control command.

The control part 202 outputs an instruction signal to the pre-driver 203 based on the motor control command from the input block 201.

In response to the instruction signal from the control part 202, the pre-driver 203 outputs a drive signal to each transistor configuring the three-phase motor drive output block 204, and controls on/off of each transistor.

The three-phase motor drive output block 204 is a three-phase inverter, is connected to the connector 21B1 to which input power from a power supply (battery) is supplied, and energizes, in response to the drive signal from the pre-driver 203, a U-phase output terminal 21A1, a V-phase output terminal 21A2, and a W-phase output terminal 21A3 which are connected to a three-phase coil of the motor 101.

The protection judgment logic circuit 205 includes a memory 205a and a power calculator 205b.

The memory 205a is an electronic element capable of writing, storing, and reading a predetermined input power limit value and a predetermined output power limit value. Here, for example, the predetermined input power limit value and the predetermined output power limit value can be input by a user of the IPD 200 by the connector 21B or the connector 21C.

An input current measured by an input current monitor circuit 206a and an input voltage measured by an input voltage monitor circuit 206b are input to the power calculator 205b, and the power calculator 205b calculates input power. In addition, an output current measured by an output current monitor circuit 207a and an output voltage measured by an output voltage monitor circuit 207b are input to the power calculator 205b, and the power calculator 205b calculates output power.

The protection judgment logic circuit 205 compares the calculated input power with the predetermined input power limit value, and outputs the input power judgment result to the control part 202. In addition, the protection judgment logic circuit 205 compares the calculated output power with the predetermined output power limit value, and outputs the output power judgment result to the control part 202.

When the input power judgment result is that the calculated input power ≥ the predetermined input power limit value, for example, the control part 202 outputs an instruction signal for lowering a voltage level of the drive signal output by the pre-driver 203. Accordingly, the input power to the three-phase motor drive output block 204 can be controlled to approach the predetermined input power limit value.

In addition, when the input power judgment result is that the calculated input power < the predetermined input power limit value, for example, the control part 202 informs the user by a warning display circuit (not shown) that the input power does not reach the predetermined input power limit value. Accordingly, by resetting the predetermined input power limit value, the input power to the three-phase motor drive output block 204 can be controlled to approach the predetermined input power limit value.

In addition, when the output power judgment result is that the calculated output power ≥ the predetermined output power limit value, for example, the control part 202 outputs an instruction signal for lowering a DUTY of the drive signal output by the pre-driver 203. Accordingly, the output power from the three-phase motor drive output block 204 can be controlled to approach the predetermined output power limit value. In addition, when the output power judgment result is that the calculated output power <the predetermined output power limit value, for example, the control part 202 outputs an instruction signal for increasing the DUTY of the drive signal output by the pre-driver 203. Accordingly, the output power from the three-phase motor drive output block 204 can be controlled to approach the predetermined output power limit value.

Conventionally, in order to limit the current, a voltage drop of a shunt resistor is detected by a LSI and compared with a reference voltage.

On the contrary, in the IPD 200, the input current and the input voltage are monitored, and the input power is calculated. In addition, the memory 205a can also be added to determine (change) an arbitrary input power limit value. Similarly, by the configuration in which the output power can also be calculated on an output side, the power limit on the input side power and the power limit on the output side can be selected according to a product.

That is, the power limit can be performed by adding a power calculation function inside the IPD 200 and feeding back the power calculation function. In addition, by adding the memory function, the value of the power limit can be changed according to a request of the car maker.

Figure 11:
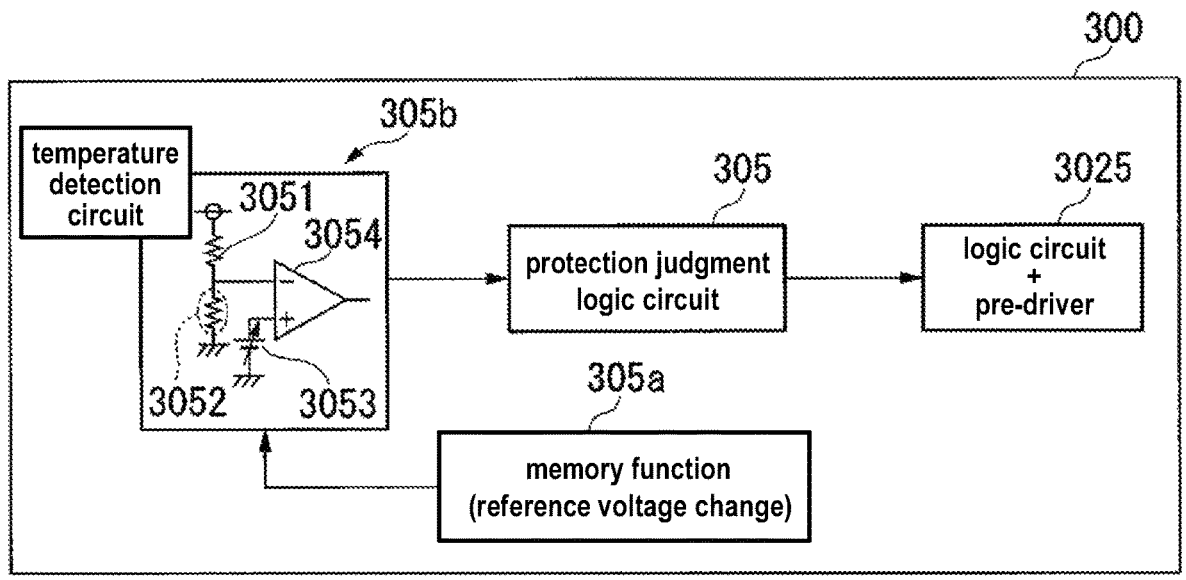
FIG. 11 is a block diagram showing a configuration of an IPD 300.

Next, an IPD 300 is described. FIG. 11 is a block diagram showing a configuration of the IPD 300.

In a conventional IPD, for overheat protection, a temperature is measured by a thermistor, the measured temperature is converted into a voltage and compared with a reference voltage value, and thereby, whether the overheat protection is necessary is judged. However, in order to change a heating protection threshold value which is the reference voltage value, the power supply for supplying the reference voltage value is a fixed power supply, and thus, if the fixed power supply is hardware, the hardware must be changed. Thus, it is not easy that the IPD overheat protection threshold value changes for each car maker or each car model. Therefore, in the IPD 300, by adding a memory function, the overheat protection threshold value can be changed for each car maker or each product model.

As shown in FIG. 11, the IPD 300 includes a logic circuit+pre-driver 3025, a protection judgment logic circuit 305, a memory function 305a, and a temperature detection circuit 305b.

Moreover, the input block 201 and the three-phase motor drive output block 204 shown in FIG. 10 are omitted in FIG. 11.

The logic circuit+pre-driver 3025 includes the control part 202 and the pre-driver 203 which are shown in FIG. 10. The control part 202 outputs the instruction signal to the pre-driver 203 based on the motor control command from the input block 201. In response to the instruction signal from the control part 202, the pre-driver 203 outputs the drive signal to each transistor configuring the three-phase motor drive output block 204, and controls the on/off of each transistor.

The memory function 305a is an electronic element capable of writing, storing, and reading a predetermined overheat protection threshold value. Here, for example, the predetermined overheat protection threshold value can be input by a user of the IPD 300 with the connector 21C (not shown).

The temperature detection circuit 305b includes a resistance element 3051, a thermistor 3052, a variable voltage circuit 3053, and a comparator 3054.

One end of the resistance element 3051 is connected to the power supply terminal (the connector 21B1 shown in FIG. 10), and the other end is connected to one end of the thermistor 3052 and a (−) input terminal of the comparator 3054.

One end of the thermistor 3052 is connected to the other end of the resistance element 3051 and the (−) input terminal of the comparator 3054, and the other end of the thermistor 3052 is grounded. The thermistor is a resistor whose electrical resistance changes significantly with respect to temperature changes. Utilizing this phenomenon, the thermistor is also used as a sensor for measuring the temperature. The sensor is usually used for measurement from −50° C. to about 150° C.

The (−) input terminal of the comparator 3054 is connected to a common contact of the other end of the resistance element 3051 and the one end of the thermistor 3052, and a voltage detected by the thermistor 3052 (referred to a thermistor detection voltage) is input. A (+) input terminal of the comparator 3054 is connected to the variable voltage circuit 3053, and the voltage of the variable voltage circuit 3053 (the predetermined overheat protection threshold value) is input.

When the thermistor detection voltage ≥ the predetermined overheat protection threshold value, for example, the comparator 3054 outputs a logic signal (a judgment result) which becomes a high (H) level from a low (L) level to the protection judgment logic circuit 305.

On the other hand, when the thermistor detection voltage < the predetermined overheat protection threshold value, the comparator 3054 outputs the L-level logic signal (the judgment result) to the protection judgment logic circuit 305.

The protection judgment logic circuit 305 waveform-shapes the judgment result output by the comparator 3054 and outputs a signal of the waveform-shaped judgment result to the logic circuit+pre-driver 3025.

When the judgment result signal is that the thermistor detection voltage ≥ the predetermined overheat protection threshold value, for example, the logic circuit of the logic circuit+pre-driver 3025 outputs an instruction signal for lowering the DUTY of the drive signal output by the pre-driver 203. Accordingly, the output power from the three-phase motor drive output block 204 can be lowered and the detection voltage of the thermistor can be controlled to approach the predetermined overheat protection threshold value.

In addition, when the judgment result signal is that the thermistor detection voltage < the predetermined overheat protection threshold value, for example, the logic circuit of the logic circuit+pre-driver 3025 outputs an instruction signal for increasing the DUTY of the drive signal output by the pre-driver 203. Accordingly, even if the output power from the three-phase motor drive output block 204 is increased, the detection voltage of the thermistor can be controlled to approach the predetermined overheat protection threshold value.

In the conventional IPD, as described above, for the overheat protection, the temperature is measured by the thermistor, and the measured temperature is converted into the voltage and compared with the reference voltage value, and thereby, whether the overheat protection is necessary is judged. However, in order to change the heating protection threshold value which is the reference voltage value, the power supply for supplying the reference voltage value is the fixed power supply, and thus, if the fixed power supply is the hardware, the hardware must be changed. Thus, it is not easy that the IPD overheat protection threshold value changes for each car maker or each car model.

Therefore, in the IPD 300, by adding the memory function, the overheat protection threshold value can be changed for each car maker or each product model.

Figure 12:
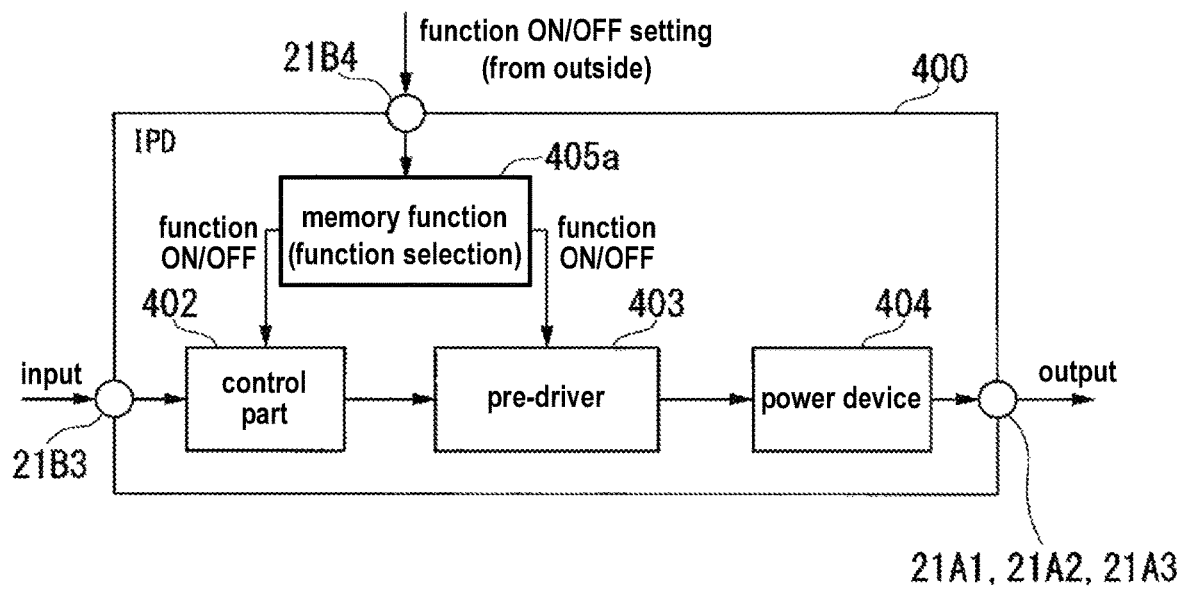
FIG. 12 is a block diagram showing a configuration of an IPD 400.

Next, an IPD 400 is described. FIG. 12 is a block diagram showing a configuration of the IPD 400.

In the conventional IPD, the function of the control part is specialized for a specific motor (for example, a fan motor), and thus this IPD cannot be applied to another motor. For example, as the function of the control part, the fan motor starts slowly, but an oil pump must start quickly, and thus the IPD cannot be applied to the oil pump. As described above, there is a problem that because the motors to which the IPD can be applied are limited, a quantity merit at the time of production cannot be obtained and cost cannot be reduced.

Therefore, the IPD 400 can be applied to various motors by adding a memory function, and thus, a quantity merit when the same IPD is produced can be easily achieved.

As shown in FIG. 12, the IPD 400 includes a control part 402, a pre-driver 403, a power device 404, and a memory function 405a.

Moreover, the input block 201 shown in FIG. 10 is omitted in FIG. 12.

The control part 402 outputs an instruction signal to the pre-driver 403 based on the motor control command from the input block 201 shown in FIG. 10.

In response to the instruction signal from the control part 402, the pre-driver 403 outputs a drive signal to each transistor configuring the power device 404, and controls on/off of each transistor.

The power device 404 is a three-phase inverter and energizes, in response to the drive signal from the pre-driver 403, a U-phase output terminal 21A1, a V-phase output terminal 21A2, and a W-phase output terminal 21A3 which are connected to the three-phase coil of the motor 101.

The memory function 405a is an electronic element capable of writing, storing, and reading setting data for selecting a predetermined function. Here, for example, the setting data for selecting the predetermined function is configured to be input by a user of IPD 400 with a connector 21B4.

In the embodiment, the setting data has two types which are function ON and function OFF. Besides, as shown in FIG. 12, the memory function 405a outputs the function OFF to the control part 402 and the pre-driver 403, and thereby the power device 404 operates in a first energization mode to energize the U-phase output terminal 21A1, the V-phase output terminal 21A2, and the W-phase output terminal 21A3 which are connected to the three-phase coil of the motor 101.

On the other hand, the memory function 405a outputs the function ON to the control part 402 and the pre-driver 403, and thereby the power device 404 operates in a second energization mode to energize the U-phase output terminal 21A1, the V-phase output terminal 21A2, and the W-phase output terminal 21A3 which are connected to the three-phase coil of the motor 101.

Here, in the first energization mode, the control part 402 outputs, for example, a first instruction signal for using a DUTY of the drive signal output by the pre-driver 403 as a predetermined DUTY. Accordingly, output power from the power device 404 can be controlled to approach a predetermined output power value (here, the motor 101 can be slowly started).

In addition, in the second energization mode, the control part 402 outputs, for example, an instruction signal for increasing the DUTY of the drive signal output by the pre-driver 403. Accordingly, output power from the power device 404 can be controlled to approach an output power value greater than the predetermined output power value in the first energization mode (here, the motor 101 can be suddenly started).

In the conventional IPD, as described above, the function of the control part is specialized for the specific motor (for example, the fan motor), and thus this IPD cannot be applied to another motor. For example, as the function of the control part, the fan motor starts slowly, but the oil pump must start quickly, and thus the IPD cannot be applied to the oil pump. As described above, there is a problem that because the motors to which the IPD can be applied are limited, the quantity merit at the time of production cannot be obtained and the cost cannot be reduced.

Therefore, the IPD 400 can be applied to various motors by adding the memory function, and thus, the quantity merit when the same IPD is produced can be easily achieved.

Figure 13:
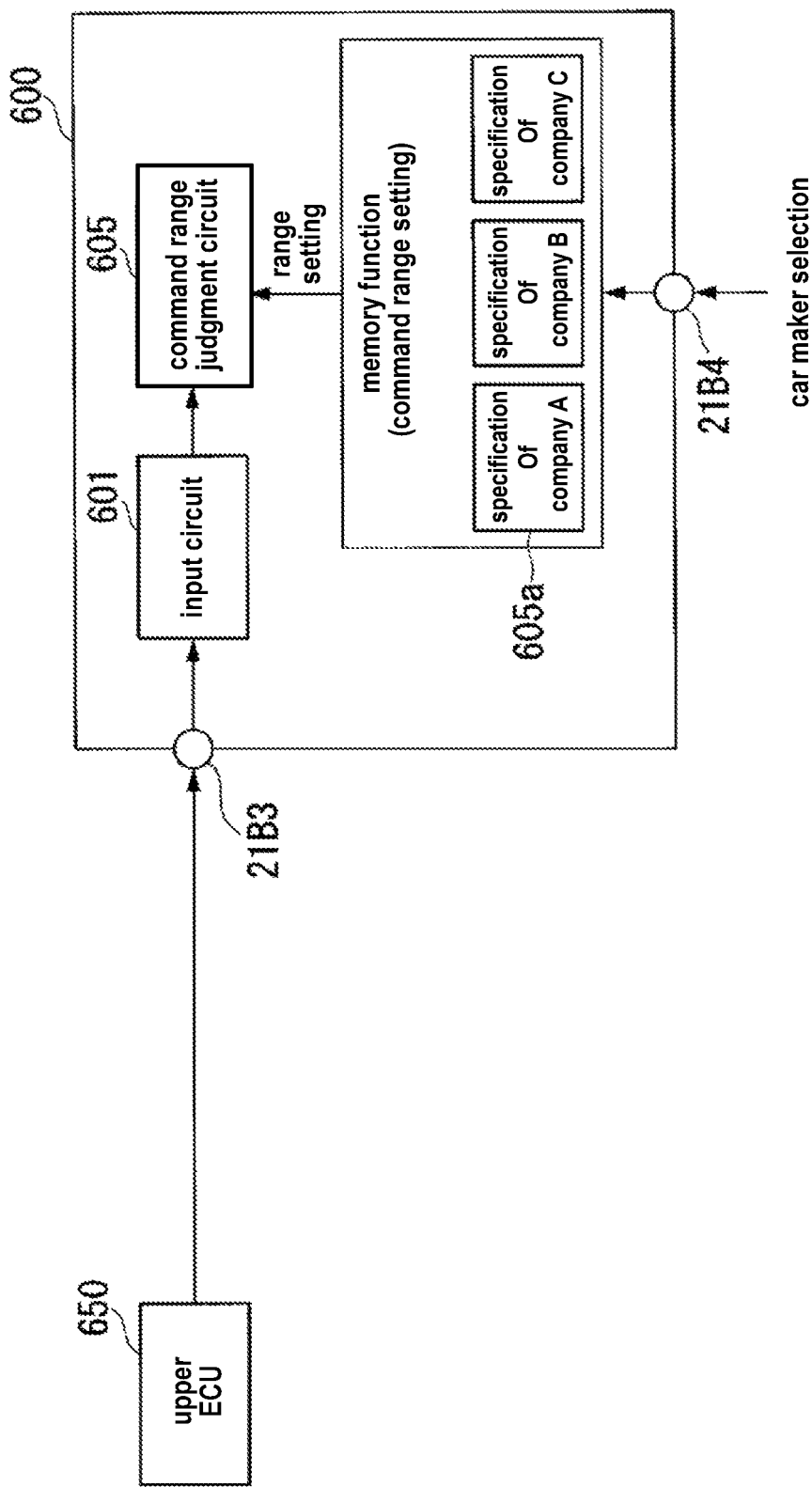
FIG. 13 is a block diagram showing a configuration of an IPD 600.

Next, an IPD 600 is described. FIG. 13 is a block diagram showing a configuration of the IPD 600.

In the conventional IPD, a command pulse input frequency can only be subjected to a fixed setting (for example: 5 to 80 Hz). However, between a vehicle upper ECU and the IPD, if a command pulse specification is, for example, a specification of company A, a frequency range is determined as 25 Hz±2 Hz. However, because the setting for accepting a command pulse on the IPD side is fixed (for example: 5 to 80 Hz) as described above, when a command of the upper ECU is, for example, 50 Hz as a specification of another company, the command deviates from the "frequency range of 25 Hz±2 Hz" as the command pulse specification determined between the vehicle upper ECU and the IPD. However, because the command of this upper ECU is in the range of the fixed setting (for example: 5 to 80 Hz) as the command pulse input frequency, the system (IPD) operates in a state that the system cannot be judged as abnormal. For example, as a result, the IPD continues to operate even in a state of IPD abnormality, and thus, when the fan motor is driven, engine cooling becomes excessive and vehicle fuel consumption will be lowered.

In addition, because the command pulse input frequency is different for each car maker, the command pulse specification must be set for each car maker, and derivative models cannot be developed.

Therefore, in the IPD 600, the command pulse input frequency can be changed by adding a memory function.

As shown in FIG. 13, the IPD 600 includes an input circuit 601, a command range judgment circuit 605, and a memory function 605a.

Moreover, the control part 202, the pre-driver 203, and the three-phase motor drive output block 204 which are shown in FIG. 10 are omitted in FIG. 13.

The input circuit 601 corresponds to the input block 201 shown in FIG. 10 and outputs, to the command range judgment circuit 605 as a motor control command, the command pulse input frequency which is the command coming from the upper ECU 650 and input to the input terminal 21B3.

When the command pulse input frequency input as the motor control command is within the command range set in the memory function 605a, the command range judgment circuit 605 outputs this motor control command to the control part 202 shown in FIG. 10.

The control part 202 outputs an instruction signal to the pre-driver 203 shown in FIG. 10 based on the motor control command from the command range judgment circuit 605.

In response to the instruction signal from the control part 202, the pre-driver 203 outputs a drive signal to each transistor configuring the three-phase motor drive output block 204 shown in FIG. 10, and controls on/off of each transistor.

Here, the command pulse input frequency is a value representing a frequency of the drive signal (the command pulse). The pre-driver 203 changes the DUTY of the drive signal in a range of 0% to 100% according to the instruction signal from the control part 202. Here, the DUTY is a value defined as a H-level period of this drive signal/one cycle of this drive signal (=the H-level period of the drive signal×one frequency of this drive signal).

In response to the instruction signal from the control part 202, the pre-driver 403 determines the frequency and the DUTY of the drive signal, outputs the drive signal to each transistor configuring the three-phase motor drive output block 204, and controls the on/off of each transistor.

In the memory function 605a, a command range is set in which a predetermined upper limit/lower limit (for example, ±8%) is added to the command pulse specification for each car maker. Here, as shown in FIG. 13, the connector 21B4 is arranged in order to select the set command range. The user can select any command range via the connector 21B4.

When the command pulse input frequency input as the motor control command is within the selected command range, the command range judgment circuit 605 outputs this motor control command to the control part 202.

The control part 202 outputs an instruction signal to the pre-driver 203 based on the motor control command from the command range judgment circuit 605.

In response to the instruction signal from the control part 202, the pre-driver 203 determines the frequency and the DUTY of the drive signal, outputs the drive signal to each transistor configuring the three-phase motor drive output block 204, and controls the on/off of each transistor.

In the conventional IPD, as described above, the setting for accepting the command pulse is fixed, and thus the IPD operates in a state that the IPD cannot be judged as abnormal even if the command pulse deviates from the command range. On the contrary, in the IPD of the embodiment, the IPD 600 which is not desired to operate at the time of abnormality can be shifted to an operation at the time of abnormality (fail-safe). For example, when the command pulse input frequency input as the motor control command is not within the command range set in the memory function 605a, the command range judgment circuit 605 outputs an instruction signal for causing the DUTY of the motor to approach 0% to the control part without changing the frequency indicated by this motor control command, to thereby bring the motor into a state close to stopping. In addition, in the conventional IPD, the command pulse specification must be set for each car maker, and the derivative models cannot be developed. In the IPD 600, the command pulse specification for each car maker is previously set in the memory, and thus correspondence is facilitated and generality is increased.

That is, in the IPD 600, the command pulse input frequency can be changed by adding the memory function inside the IPD.

Figure 14:
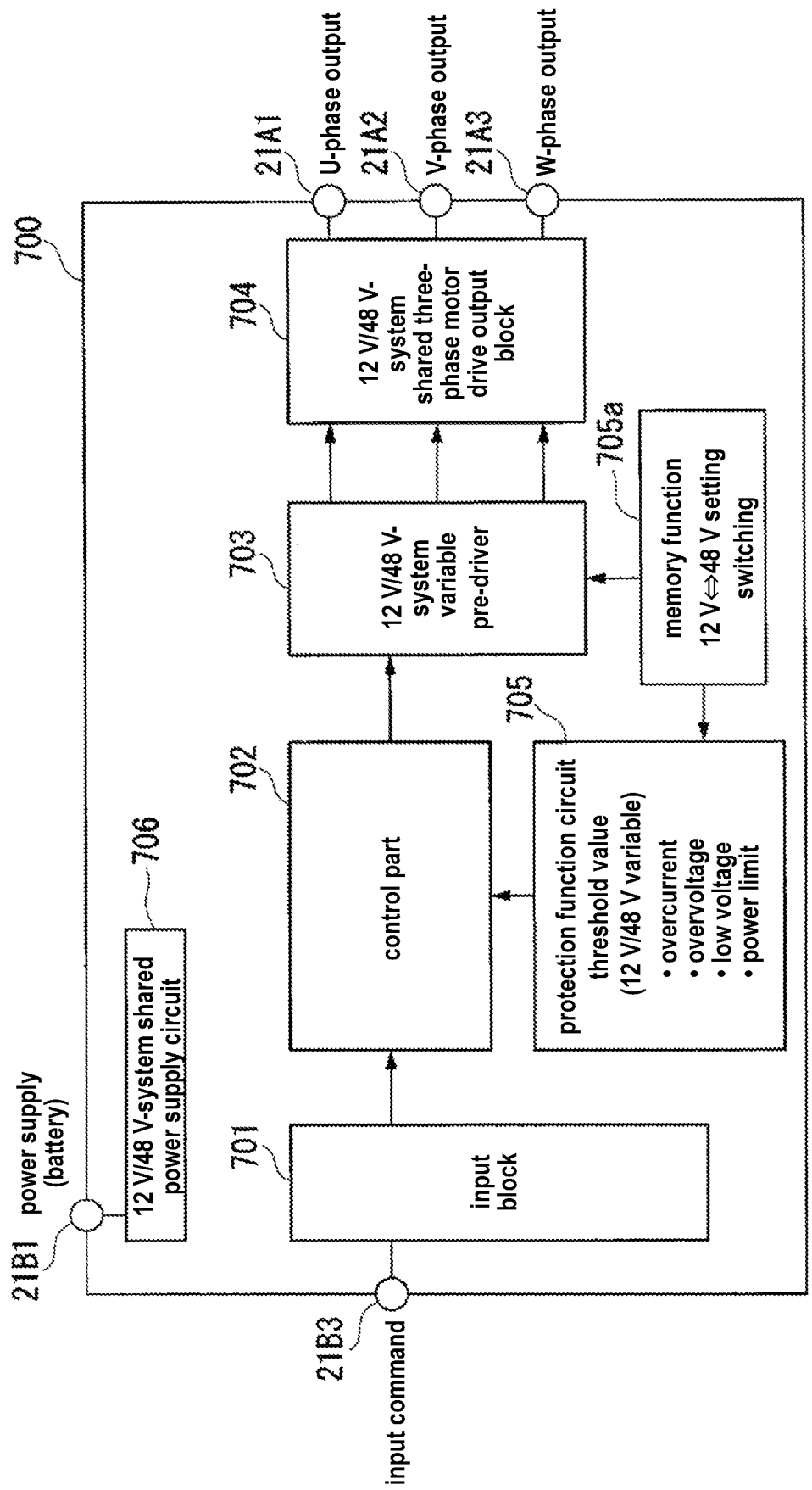
FIG. 14 is a block diagram showing a configuration of an IPD 700.

Next, an IPD 700 is described. FIG. 14 is a block diagram showing a configuration of the IPD 700.

The IPD 700 is a device in which 12 V and 48 V specifications can be changed with one hardware by adding a memory function to the IPD.

The IPD 700 includes a 12 V/48 V-system shared power supply circuit 706, an input block 701, a control part 702, a 12 V/48 V-system variable pre-driver 703, a 12 V/48 V-system shared three-phase motor drive output block 704, a protection function circuit 705, and a memory function 705a.

The input block 701 outputs a command for motor drive and motor stop that is input to the input terminal 21B3 to the control part 702 as a motor control command.

The control part 702 outputs an instruction signal to the 12 V/48 V-system variable pre-driver based on the motor control command from the input block 701.

In response to the instruction signal from the control part 702, the 12 V/48 V-system variable pre-driver 703 outputs a drive signal to each transistor configuring the 12 V/48 V-system shared three-phase motor drive output block, and controls on/off of each transistor.

The 12 V/48 V-system shared three-phase motor drive output block 704 is a three-phase inverter, is connected to the 12 V/48 V-system shared power supply circuit 706 which is connected to the connector 21B1 to which the input power from the power supply (battery) is supplied, and energizes, in response to the drive signal from the pre-driver 203, the U-phase output terminal 21A1, the V-phase output terminal 21A2, and the W-phase output terminal 21A3 which are connected to the three-phase coil of the motor 101.

The protection function circuit 705 is connected to the memory function 705a.

The memory function 705a is an electronic element capable of writing, storing, and reading a threshold value of overcurrent detection in a 12 V/48 V-system and a hysteresis value corresponding to a difference between overcurrent detection threshold values in a 12 V-system and a 48 V-system. Here, for example, the threshold value of the overcurrent detection in the 12 V/48 V-system and the hysteresis value for the overcurrent detection in the 12 V-system and the 48 V-system can be input by a user of the IPD 700 with the connector 21B or the connector 21C. In addition, the memory function 705a is an electronic element capable of writing, storing, and reading a threshold value of overvoltage detection in the 12 V/48 V-system and a hysteresis value corresponding to a difference between overvoltage detection threshold values in the 12 V-system and the 48 V-system.

In addition, the memory function 705a is an electronic element capable of writing, storing, and reading a threshold value of low-voltage detection in the 12 V/48 V-system and a hysteresis value corresponding to a difference between low-voltage detection threshold values in the 12 V-system and the 48 V-system. In addition, the memory function 705a is an electronic element capable of writing, storing, and reading a threshold value of power limit detection in the 12 V/48 V-system and a hysteresis value corresponding to a difference between power limit detection threshold values in the 12 V-system and the 48 V-system.

The memory function 705a outputs, to the protection function circuit 705, operation voltage data indicating which one of the voltage systems of 12 V and 48 V the IPD 700 operates in, the threshold values used for the 12 V/48V-system detection (the overvoltage detection threshold value, the overcurrent detection threshold value, the low-voltage detection threshold value, and the power limit detection threshold value), and the hysteresis values (the values corresponding to the differences between the overvoltage detection threshold values, the overcurrent detection threshold values, the low-voltage detection threshold values, and the power limit detection threshold values of the 12 V-system and the 48 V-system).

In addition, when the IPD 700 is switched from the 12 V-system to the 48 V-system or from the 48 V-system to the 12 V-system, the memory function 705a outputs a second instruction signal accompanying the switching to the 12 V/48 V-system variable pre-driver 703. Then, the memory function 705a outputs, in synchronization with the instruction signal from the control part 702 with respect to the 12 V/48 V-system variable pre-driver 703, a drive signal corresponding to the 12 V-system or the 48 V-system to each transistor configuring the 12 V/48 V-system shared three-phase motor drive output block 704, and controls on/off of each transistor.

When the operation voltage data input from the memory function 705a indicates 12 V, for example, the protection function circuit 705 compares, as follows, a magnitude of a voltage value (voltage detection value) measured by a voltage measurement part with the overvoltage detection threshold value used for the 12 V-system detection and input from the memory function 705a, and outputs an overvoltage detection judgment result to the control part 202, wherein the voltage measurement part is arranged between the 12 V/48 V-system shared three-phase motor drive output block 704 and the 12 V/48 V-system shared power supply circuit 706.

When the overvoltage detection judgment result is that the voltage detection value ≥ the overvoltage detection threshold value, for example, the control part 202 outputs an instruction signal for lowering the DUTY of the drive signal output by the pre-driver 203. Accordingly, the voltage detection value can be controlled to approach the overvoltage detection threshold value.

In addition, when the output power judgment result is that the voltage detection value < the overvoltage detection threshold value, for example, the control part 202 outputs an instruction signal for increasing the DUTY of the drive signal output by the pre-driver 203. Accordingly, the voltage detection value can be controlled to approach the overvoltage detection threshold value.

On the other hand, when the operation voltage data input from the memory function 705a indicates 48 V, for example, the protection function circuit 705 compares, as follows, the magnitude of the voltage detection value measured by the voltage measurement part with the overvoltage detection threshold value and the hysteresis value used for the 12 V-system detection and input from the memory function 705a, and outputs the overvoltage detection judgment result to the control part 202.

When the overvoltage detection judgment result is that the voltage detection value ≥(the overvoltage detection threshold value + the hysteresis value), for example, the control part 202 outputs an instruction signal for lowering the DUTY of the drive signal output by the pre-driver 203. Accordingly, the voltage detection value can be controlled to approach the overvoltage detection threshold value.

In addition, when the output power judgment result is that the voltage detection value <(the overvoltage detection threshold value+ the hysteresis value), for example, the control part 202 outputs an instruction signal for increasing the DUTY of the drive signal output by the pre-driver 203. Accordingly, the voltage detection value can be controlled to approach the overvoltage detection threshold value.

Conventionally, the IPD is designed as hardware exclusively for a 12 V power supply, but cannot support a 48 V power supply beginning to be supported in Europe, and another kind of hardware needs to be set again.

On the contrary, in the IPD 700, it is not necessary to consider the conventional 12 V-system and the 48 V-system supported in Europe as separate ones. For example, the threshold value of the overvoltage detection (overvoltage detection threshold value) and the hysteresis value can be set and changed at 12 V/48 V. Moreover, the threshold value of the overvoltage detection (overcurrent detection threshold value) and the hysteresis value thereof, the threshold value of the low-voltage detection (low-voltage detection threshold value) and the hysteresis value thereof, and the threshold value of the power limit detection (power limit detection threshold value) and the hysteresis value thereof may be set and changed at 12 V/48 V.

That is, by adding the memory function of the IPD 700, the 12 V and 48 V specifications can be changed with one hardware.

Figure 15:
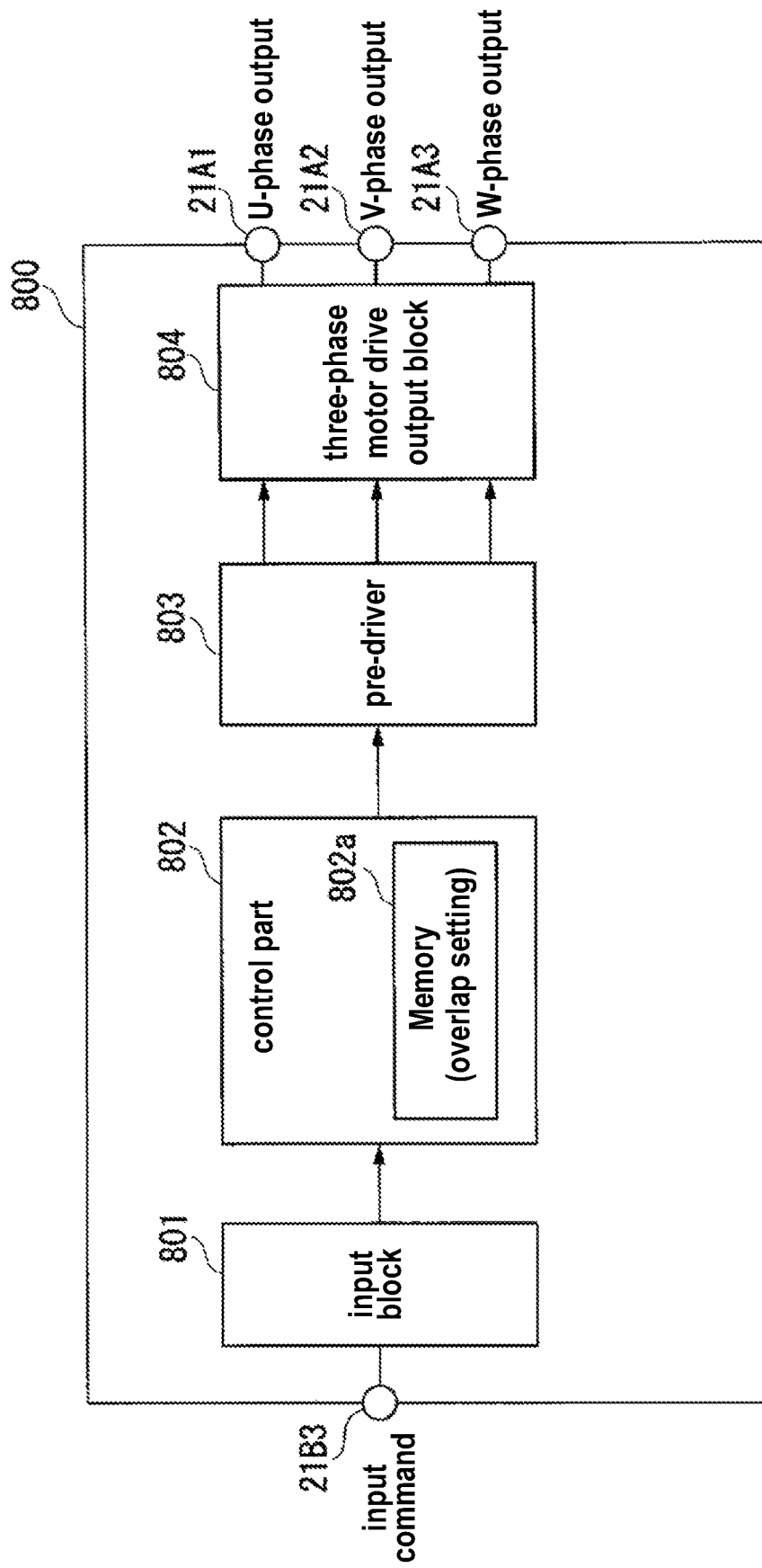
FIG. 15 is a block diagram showing a configuration of an IPD 800.
Figure 16:
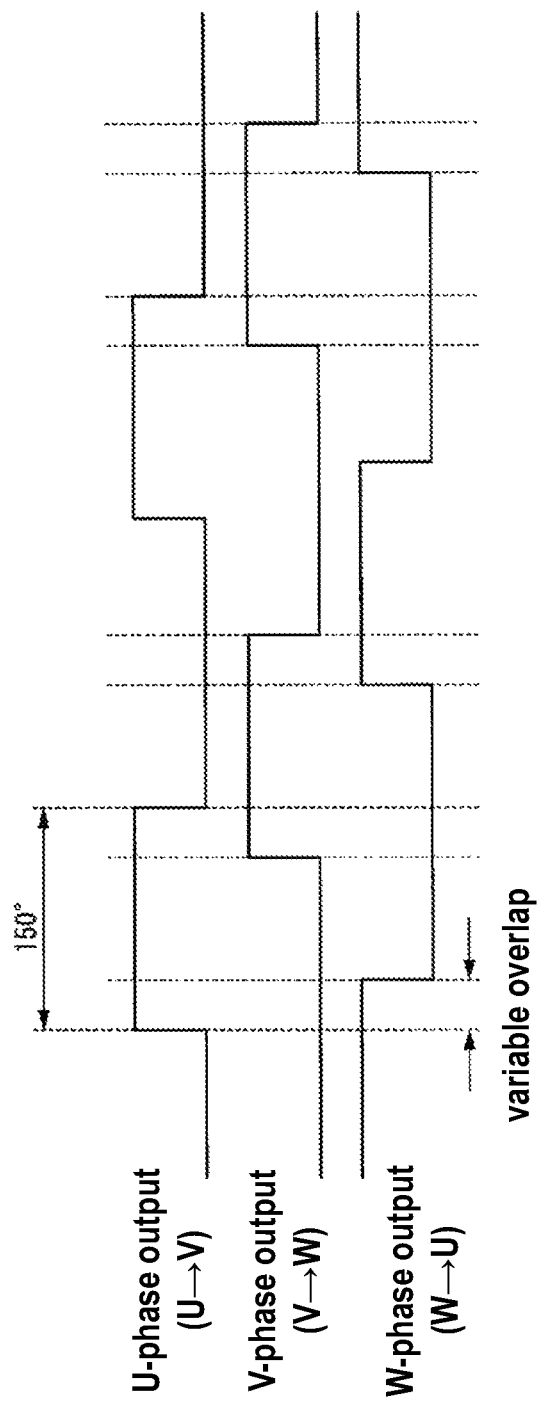
FIG. 16 is a diagram showing an overlapping variable rectangular wave energization pattern output by the IPD 800.

Next, an IPD 800 is described. FIG. 15 is a block diagram showing a configuration of the IPD 800. In addition, FIG. 16 is a diagram showing an overlapping variable rectangular wave energization pattern output by the IPD 800.

The IPD 800 is a device for reducing a volume generated when the motor 101, which is a target to which the IPD 800 is energized, rotates.

The IPD 800 includes an input block 801, a control part 802, a pre-driver 803, and a three-phase motor drive output block 804.

The input block 801 outputs a command for driving the motor and stopping the motor, which is input to the input terminal 21B3, to the control part 802 as a motor control command.

The control part 802 outputs an instruction signal to the pre-driver 803 based on the motor control command from the input block 801.

In response to the instruction signal from the control part 802, the pre-driver 803 outputs a drive signal to each transistor configuring the three-phase motor drive output block 804, and controls on/off of each transistor.

The three-phase motor drive output block 804 is a three-phase inverter, is connected to the connector 21B1 (not shown in FIG. 15) to which the input power from the power supply (battery) is supplied, and energizes, in response to the drive signal from the pre-driver 803, the U-phase output terminal 21A1, the V-phase output terminal 21A2, and the W-phase output terminal 21A3 which are connected to the three-phase coil of the motor 101.

The control part 802 includes a memory 802a.

The memory 802a is an electronic element capable of writing, storing, and reading a predetermined overlap (hereinafter, referred to as variable overlap). Here, for example, the predetermined overlap can be input by a user of the IPD 800 with the connector 21B or the connector 21C.

Moreover, the overlap refers to, for example, a period in which a H level of a U-phase output, a H level of a W-phase output, and a H level of a V-phase output overlap. Conventionally, this overlap has been fixed at, for example, 15° in the case of 150° rectangular wave energization. However, because the memory 802a stores the variable overlap, the overlap can be changed between 0° and 75° in the case of the 150° rectangular wave energization, and can be set to a variable overlap value at which the noise reduction is achieved most.

The control part 802 outputs an instruction signal including this variable overlap to the pre-driver 803.

In the pre-driver 803, in response to the instruction signal from the control part 802, the three-phase motor drive output block 204 outputs a drive signal for energizing, according to the rectangular wave energization pattern shown in FIG. 16, the U-phase output terminal 21A 1, the V-phase output terminal 21A2, and the W-phase output terminal 21A3 which are connected to the three-phase coil of the motor 101.

Accordingly, the IPD 800 can energize each phase by the rectangular wave energization pattern for the purpose of noise reduction.

In the conventional IPD, when a three-phase rectangular wave energization method is selected for driving the motor, for example, if the purpose is the noise reduction, the 150° rectangular wave energization is considered. The conventional IPD is a driver that energizes a pattern with a fixed overlap, and the amount of overlap could only be set to a fixed value (for example, the above 15°), and an effect on quietness cannot be optimized. On the contrary, in the IPD 800, the memory function can be added, the amount of overlap can be changed according to the motor specification, and the optimum quietness can be set.

That is, in the IPD 800, by adding a memory function to the IPD, the overlap can be changed from the fixed setting to a variable setting.

Figure 17:
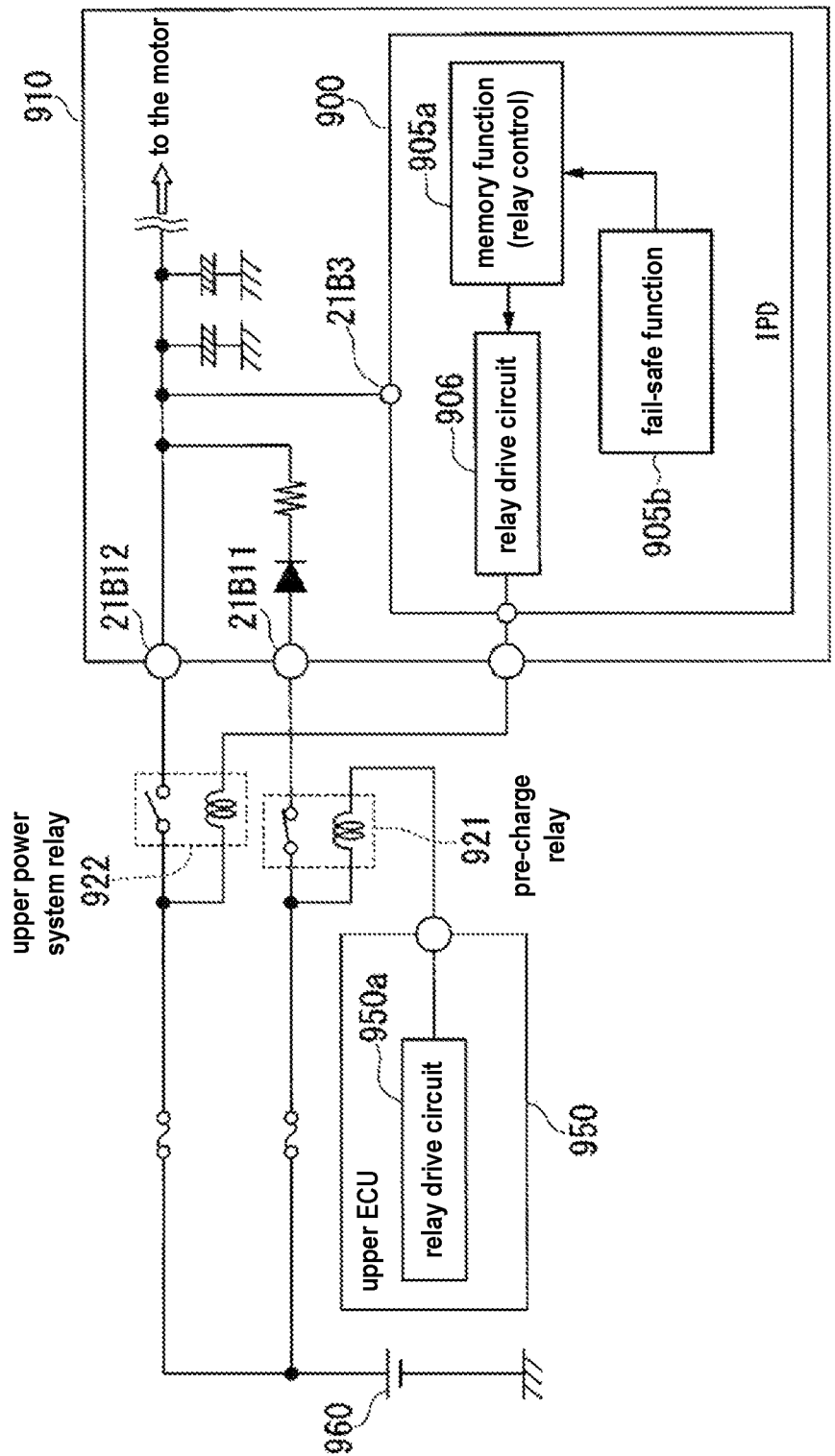
FIG. 17 is a block diagram showing a configuration of an IPD 900.

Next, an IPD 900 is described. FIG. 17 is a block diagram showing a configuration of the IPD 900. FIG. 17 shows an ASSEMBLY 910 having the IPD 900 as a component.

Because a conventional ASSEMBLY does not have a control means (on/off control) for an upper power relay, the control of the upper power relay relies on an upper ECU. That is, the upper ECU controls all of a plurality of power relays used when power is supplied from the power supply (battery) to the motor.

In this configuration, it is necessary to give the upper ECU many functions, and particularly, it is expected that the relay control becomes a burden in the case of a high function ECU such as an engine ECU.

Therefore, a purpose of the ASSEMBLY 910 is to add a relay drive circuit and a memory function inside the IPD so that the upper power relay can be controlled (turned on/off).

As shown in FIG. 17, the IPD 900 includes a memory function 905a, a fail-safe function 905b, and a relay drive circuit 906.

In addition, an upper ECU 950 includes a relay drive circuit 950a.

In addition, a power supply 960 supplies power to the motor via a power supply path configured by a pre-charge relay 921 and a connector 21B11 of the ASSEMBLY 910.

In addition, the power supply 960 supplies power to the motor via a power supply path configured by an upper power relay 922 and a connector 21B12 of the ASSEMBLY 910.

Here, the relay drive circuit 950a of the upper ECU 950 outputs a first control signal that becomes H/L in order to control on/off of the pre-charge relay 921.

In addition, the relay drive circuit 906 of the IPD 900 outputs a second control signal that becomes H/L in order to control on/off of the upper power relay 922.

Accordingly, the number of the upper power relays controlled by the upper ECU 950 changes from two (the pre-charge relay 921 and the upper power relay 922) to one (the pre-charge relay 921), and thus, in vehicle design of the car maker, the control function of the upper ECU for the upper power relay can be reduced, and as a result, a load on the upper ECU can be reduced.

In addition, by incorporating the relay drive circuit 906 and the memory function 905a having the relay control function into the IPD 900, the ASSEMBLY 910 can control (turn on/off) the upper power relay 922 at any timing. As an arbitrary timing, for example, it is conceivable to turn off the upper power relay 922 at the time of fail-safe.

In this way, by combination with the fail-safe function 905b, the power supply to the motor can be completely cut off, and a safer protection state can be created. Moreover, in order to completely cut off the power supply to the motor, the relay drive circuit 950a of the upper ECU 950 needs to turn off the pre-charge relay 921, and thus a contact signal for notifying the upper ECU 950 to turn off the upper power relay 922 at the time of fail-safe is output.

However, it does not mean that the upper power relay is turned off at each time of fail-safe, and it is desirable to make settings by the memory function 905a so that the relay control (on/off) can be set as necessary for each fail-safe item.

In the conventional ASSEMBLY, as described above, it is necessary to give the upper ECU many functions, and particularly, it is expected that the relay control becomes a burden in the case of the high function ECU such as the engine ECU.

Therefore, in the ASSEMBLY 910, the relay drive circuit 906 and the memory function 905a are added inside the IPD 900 so that the upper power relay 922 can be controlled (turned on/off).

Accordingly, in the vehicle design of the car maker, the control function of the upper ECU 950 for the upper power relay 922 can be reduced, and as a result, the load on the upper ECU 950 can be reduced.

Because the configurations and the functions of the seven IPDs (the IPDs 200, 300, 400, 600, 700, 800, and 900) are described above, then, configurations and functions of iDUs 120 and 130 used as variation examples of the aforementioned iDU are described.

First, an iDU 120 is described.

In a conventional iDU, it takes time to identify failures in products returned due to market defects or the like. This is because there are many analysis procedures to identify the cause.

In addition, there are cases where handling when the defective product is taken out of the vehicle is poor, and information such as a fact that a product state has deteriorated or the like is not received.

On the contrary, in the iDU 120, fail information such as overcurrent, overvoltage, overheat, low voltage, or the like is left in a memory in the iDU 120 in order that an approximate cause of the failures can be confirmed at the timing of analysis start. In addition, vehicle environment abnormalities, such as shock, vibration, drop (for example, observed with a gyro sensor), vehicle speed abnormalities (for example, observed by detecting a wind speed with pressure), and water intrusion detection, are left.

In this way, the iDU 120 has a configuration in which a variety of fail information is left in the memory and can be read.

Accordingly, in the iDU 120, the cause of failures of the product returned due to market defects or the like can be confirmed by reading the memory information. In addition, because there are cases where the handling when the defective product is taken out of the vehicle is rough (cases of shock or drop), if the failure of shock or drop is confirmed in the memory information, separation can be performed at the time of failure analysis. In addition, the car maker or Tire 1 (a maker who supply components directly to a completed car maker) can be promptly informed.

Figure 18:
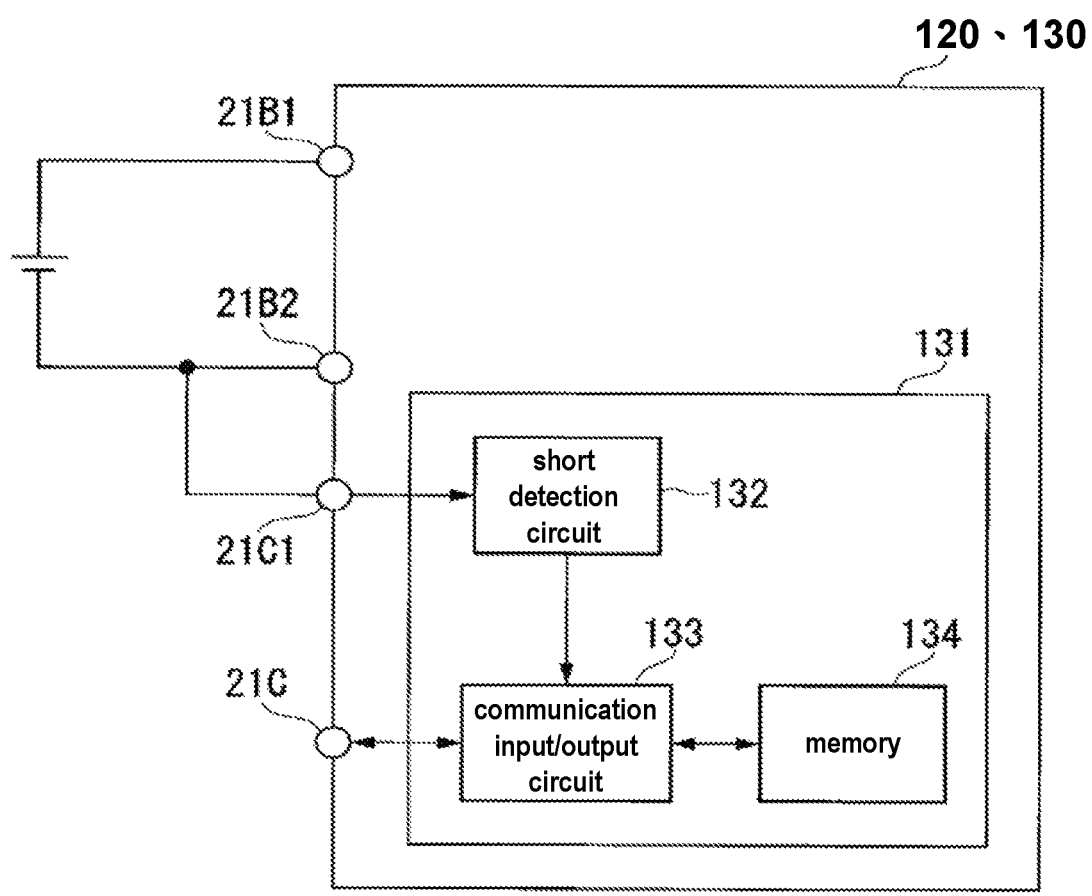
FIG. 18 is a block diagram showing a configuration of an iDU 130.

Finally, an iDU 130 is described. FIG. 18 is a block diagram showing a configuration of the iDU 130.

As threats to automobile security, various risks such as hijacking of automobile functions, remote control, the resulting loss of life, and the like are assumed.

In recent years, incidents and accidents that threaten information security caused by in-vehicle electronic devices have been confirmed, and information security needs to be strengthened. The incidents and accidents that threaten information security mostly utilize software vulnerabilities.

The memory in the iDU is assumed to be written and read using CAN communication, and measures are required for both hardware and software from the viewpoint of information security.

Therefore, in the iDU 130, security of a memory 134 is strengthened by both hardware and software measures.

As a hardware measure, memory access is physically limited by a short pin, a voltage input terminal, or the like. That is, as shown in FIG. 18, a short wire is arranged between the short pin (the connector 21C1) and the voltage input terminal (the connector 21B2). Moreover, although the short wire is arranged outside the iDU 130 in FIG. 18, the short wire may be arranged inside the iDU 130.

A memory writing/reading apparatus 131 is a circuit included by the iDU 130 and includes a short-circuit detection circuit 132, a communication input/output circuit 133, and the memory 134.

The short-circuit detection circuit 132 outputs a detection signal indicating that a noise is detected to the communication input/output circuit 133 when the noise is generated in the connector 21B2.

Accordingly, the communication input/output circuit 133 prohibits the data stored in the memory 134 from being exchanged (input/output) with the outside via the communication pin (the connector 21C). Moreover, during a period when the detection signal is not input, the data stored in the memory 134 can be exchanged with the outside via the connector 21C without being prohibited.

In this way, as a hardware measure, memory access is physically limited. In addition, as a software measure, operation limitation is set by encrypting communication information or the like to prevent unauthorized access.

That is, in the iDU 130, security can be strengthened more than before by taking measures with both software and hardware.

The embodiment of the present invention is specifically described above with reference to the drawings, but the specific configuration is not limited to the embodiment, and design changes and the like within a range not deviating from the gist of the present invention are also included.

For example, in the above embodiment, the case has been described where the motor 101 is used as, for example, a fan motor. However, the present invention is not limited hereto. The cooling fan 8 can be removed from the motor 101, and the motor 101 can be used for various purposes. At the same time, the driver 100 can be applied to the motor 101 used for various purposes.

REFERENCE SIGNS LIST

1 supporter
2 bearing member
3 rotation shaft
4 winding wire
5 stator
6 rotor magnet
7 rotor
8 fan
10 aluminum substrate
10A aluminum layer
10B insulation oxide film
11 insulating layer
12 copper foil layer
13 electronic element
14 resin member
20 mold resin part
21 connector
22 fitting part
23 frame
24 fitting hole
30 heat sink
100 driver
101 motor
A cooling air
A' cooling air
B circulating air
120, 130 iDU
200, 300, 400, 600, 700, 800, 900 IPD
201, 701, 801 input block
202, 402, 702, 802 control part
203, 403, 803, 3025 pre-driver
204, 804 three-phase motor drive output block
205, 305 protection judgment logic circuit
305a, 405a, 605a, 705a, 905a memory function
134, 205a, 802a memory

What is claimed is:

1. A driver for motors, comprising:
   an aluminum substrate which forms one surface of a housing;
   an insulating layer which is formed on a surface of the aluminum substrate;
   a plurality of electronic elements which are bonded to the insulating layer at a surface on a side opposite to the aluminum substrate; and
   a resin member that covers the surface onto which the electronic elements are bonded, wherein
   the resin member is obtained by integrating a mold resin part which covers the electronic elements from an upper surface side, a connector which is electrically connected to the electronic elements, and a fitting part which is used for fitting to a motor.

2. The driver for motors according to claim 1, wherein the fitting part of the resin member comprises a frame capable of accommodating the electronic elements, and the mold resin part is filled in the frame.

3. The driver for motors according to claim 2, wherein a surface of the aluminum substrate which is positioned on a side opposite to the insulating layer is black.

4. The driver for motors according to claim 1, wherein a heat sink is arranged on a surface of the aluminum substrate which is positioned on a side opposite to the insulating layer.

5. The driver for motors according to claim 1, wherein one of the plurality of electronic elements is a memory, and a connector for writing to the memory is arranged as the connector.

6. The driver for motors according to claim 1, wherein the electronic elements are used as a control part for a motor that drives a cooling fan.

7. The driver for motors according to claim 6, wherein a ventilation area of the cooling fan driven by the motor is arranged on a surface of the aluminum substrate which is positioned on a side opposite to the insulating layer.

8. The driver for motors according to claim 2, wherein a surface of the aluminum substrate which is positioned on a side opposite to the insulating layer is black.

9. The driver for motors according to claim 2, wherein a heat sink is arranged on a surface of the aluminum substrate which is positioned on a side opposite to the insulating layer.

10. The driver for motors according to claim 3, wherein a heat sink is arranged on a surface of the aluminum substrate which is positioned on a side opposite to the insulating layer.

11. The driver for motors according to claim 2, wherein one of the plurality of electronic elements is a memory, and a connector for writing to the memory is arranged as the connector.

12. The driver for motors according to claim 3, wherein one of the plurality of electronic elements is a memory, and a connector for writing to the memory is arranged as the connector.

13. The driver for motors according to claim 4, wherein one of the plurality of electronic elements is a memory, and a connector for writing to the memory is arranged as the connector.

14. The driver for motors according to claim 2, wherein the electronic elements are used as a control part for a motor that drives a cooling fan.

15. The driver for motors according to claim 3, wherein the electronic elements are used as a control part for a motor that drives a cooling fan.

16. The driver for motors according to claim 4, wherein the electronic elements are used as a control part for a motor that drives a cooling fan.

17. The driver for motors according to claim 5, wherein the electronic elements are used as a control part for a motor that drives a cooling fan.

18. The driver for motors according to claim 14, wherein
a ventilation area of the cooling fan driven by the motor is arranged on a surface of the aluminum substrate which is positioned on a side opposite to the insulating layer.

19. The driver for motors according to claim 15, wherein
a ventilation area of the cooling fan driven by the motor is arranged on a surface of the aluminum substrate which is positioned on a side opposite to the insulating layer.

20. The driver for motors according to claim 16, wherein
a ventilation area of the cooling fan driven by the motor is arranged on a surface of the aluminum substrate which is positioned on a side opposite to the insulating layer.

* * * * *